United States Patent
Hosotani et al.

(10) Patent No.: US 9,799,383 B2
(45) Date of Patent: Oct. 24, 2017

(54) MAGNETIC MEMORY DEVICE

(71) Applicant: TOSHIBA MEMORY CORPORATION, Minato-ku, Tokyo (JP)

(72) Inventors: Keiji Hosotani, Seoul (KR); Tatsuya Kishi, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,720

(22) Filed: Sep. 9, 2016

(65) Prior Publication Data
US 2017/0263296 A1 Sep. 14, 2017

Related U.S. Application Data

(60) Provisional application No. 62/305,481, filed on Mar. 8, 2016.

(51) Int. Cl.
| | |
|---|---|
| H01L 29/82 | (2006.01) |
| G11C 11/16 | (2006.01) |
| H01L 43/02 | (2006.01) |
| H01L 43/08 | (2006.01) |
| H01L 27/22 | (2006.01) |

(52) U.S. Cl.
CPC ........ *G11C 11/161* (2013.01); *G11C 11/1655* (2013.01); *G11C 11/1673* (2013.01); *G11C 11/1675* (2013.01); *H01L 27/222* (2013.01); *H01L 43/02* (2013.01); *H01L 43/08* (2013.01)

(58) Field of Classification Search
CPC ..................................................... H01L 27/222
USPC .................................................. 257/424, 426
See application file for complete search history.

(56) References Cited

U.S. PATENT DOCUMENTS

| | | | | |
|---|---|---|---|---|
| 7,242,556 | B2 * | 7/2007 | Gill ....................... | G01R 33/093 360/324.12 |
| 7,860,351 | B2 * | 12/2010 | Yagami .................. | H01L 43/08 360/313 |
| 8,860,159 | B2 * | 10/2014 | Meitzler ................ | H01L 43/08 257/424 |
| 2008/0225577 | A1 | 9/2008 | Hosotani et al. | |
| 2011/0233697 | A1 | 9/2011 | Kajiyama | |
| 2014/0021520 | A1 | 1/2014 | Asao | |
| 2014/0284738 | A1 | 9/2014 | Nakazawa et al. | |
| 2015/0097254 | A1 | 4/2015 | Ohmori et al. | |

FOREIGN PATENT DOCUMENTS

JP 2014063804 A 4/2014

* cited by examiner

*Primary Examiner* — Chandra Chaudhari
(74) *Attorney, Agent, or Firm* — Holtz, Holtz & Volek PC

(57) ABSTRACT

According to one embodiment, the magnetic memory device includes a first magnetoresistive element and a second magnetoresistive element which are adjacent to each other. Each of the first and second magnetoresistive elements includes a first magnetic layer, a first non-magnetic later on the first magnetic layer, a second magnetic layer on the first non-magnetic layer, a second non-magnetic layer on the second magnetic layer, and a third magnetic layer on the second non-magnetic layer. Furthermore, the magnetic memory device further includes a fourth magnetic layer being in contact with the first and second magnetoresistive elements or in contact with conductive layers on the first and second magnetoresistive elements.

20 Claims, 23 Drawing Sheets

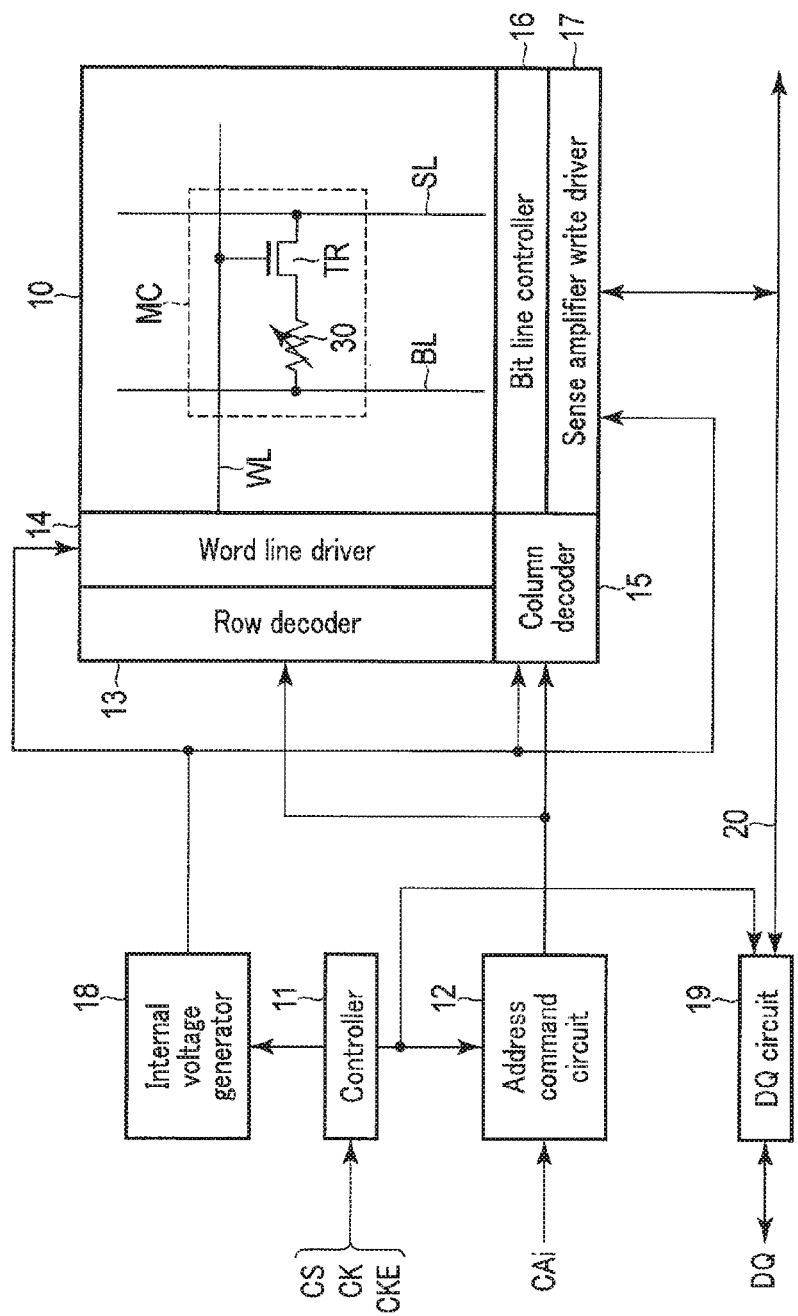
F I G. 1

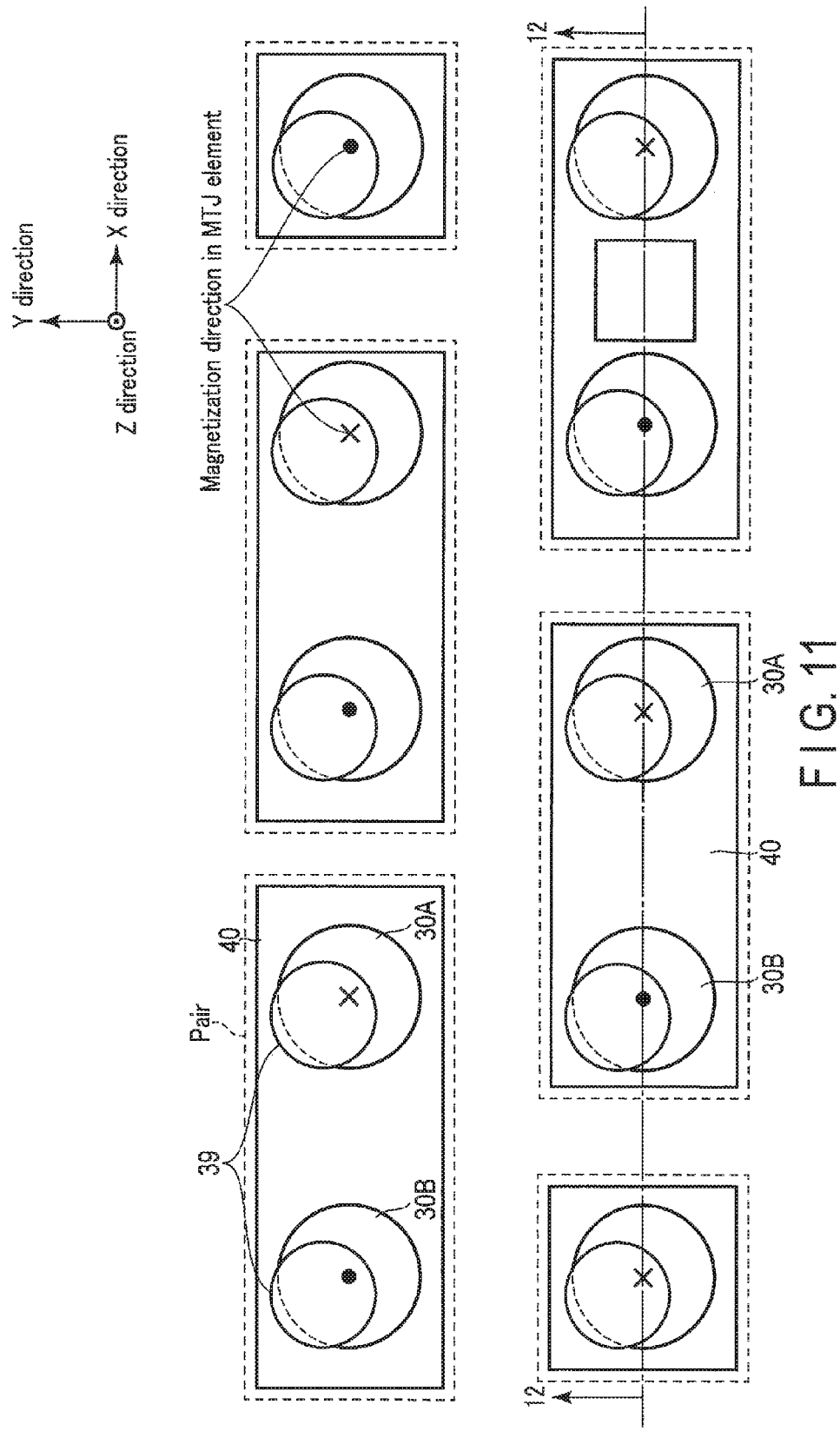
F I G. 11

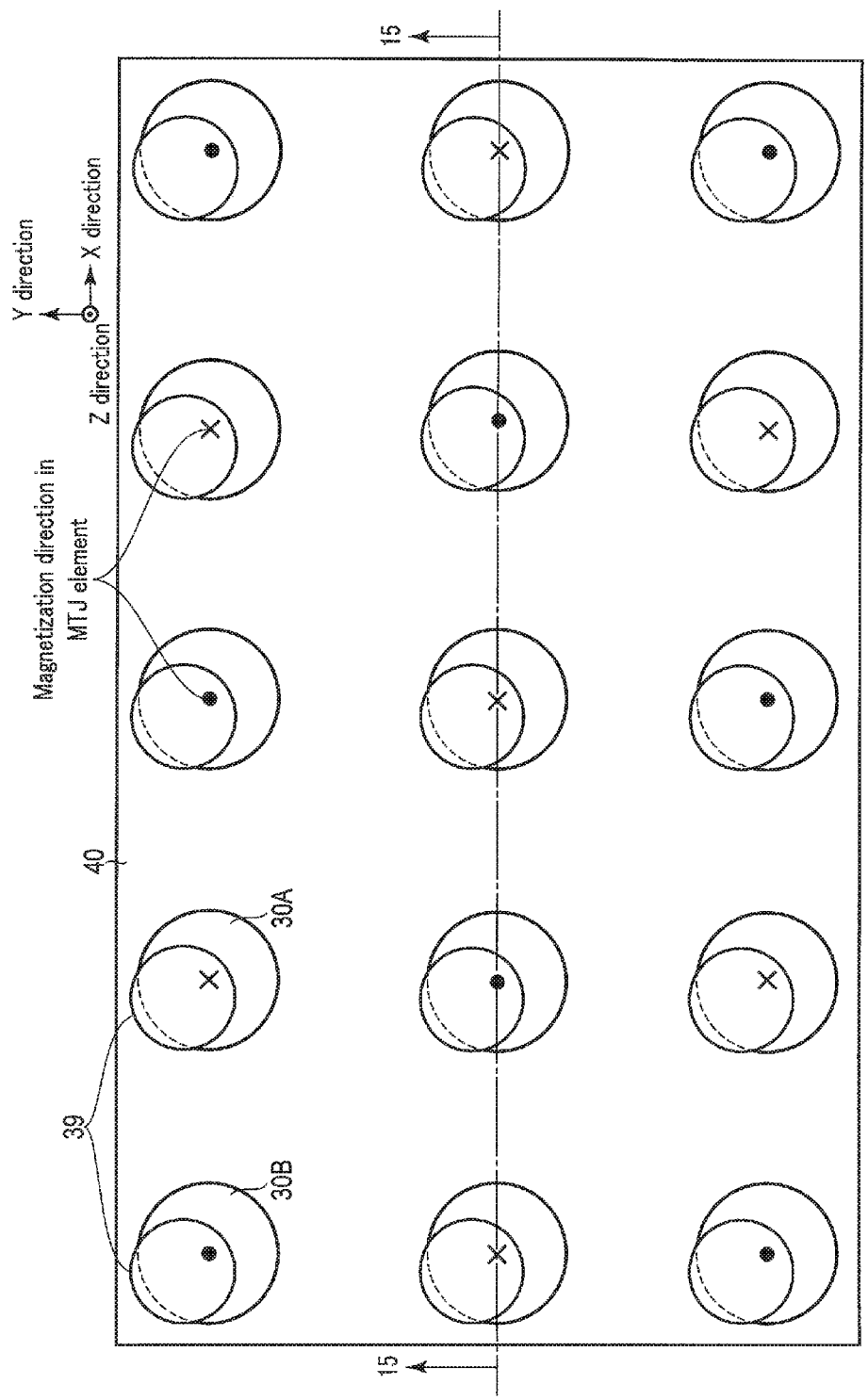
F I G. 14

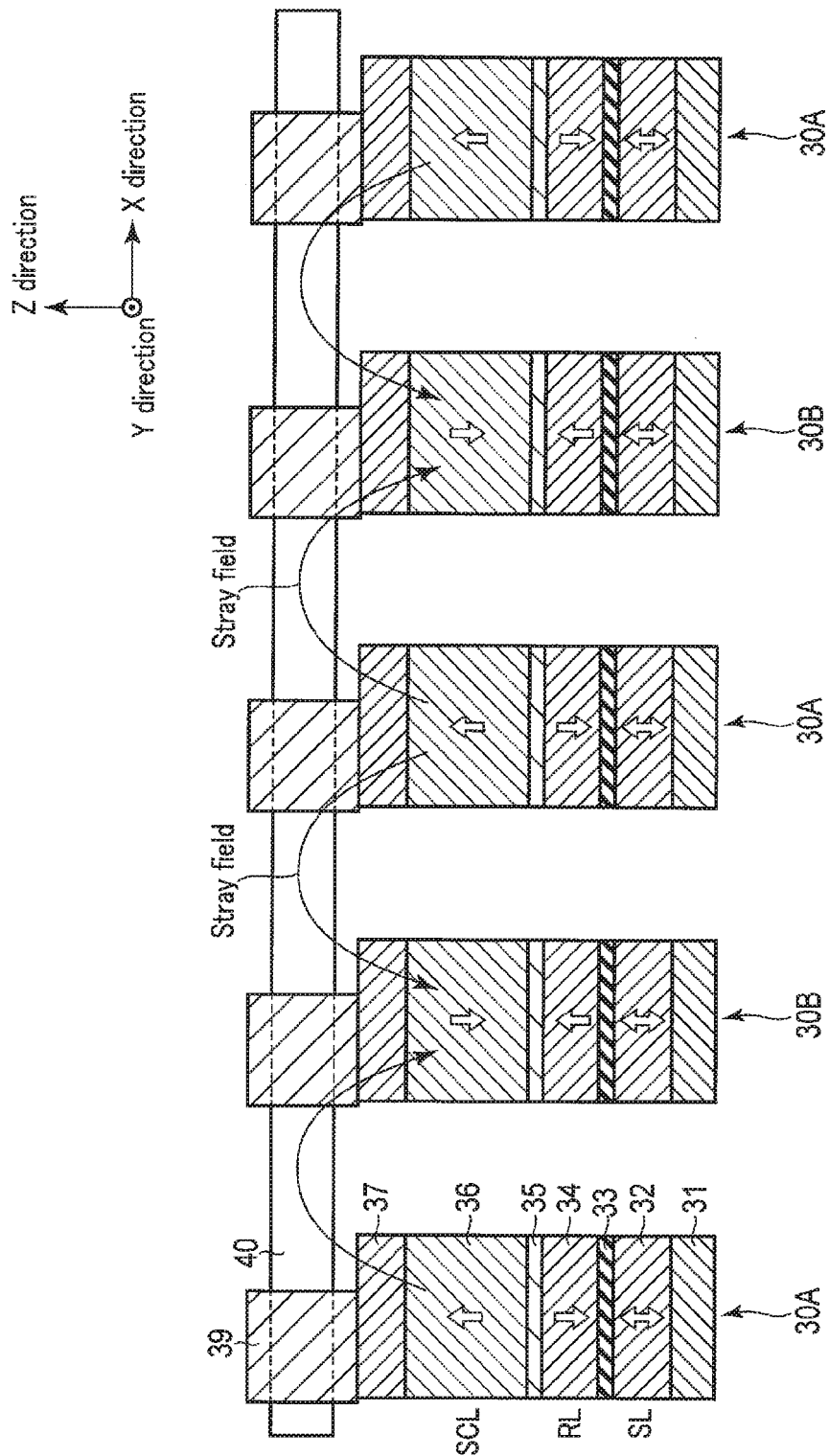
F I G. 15

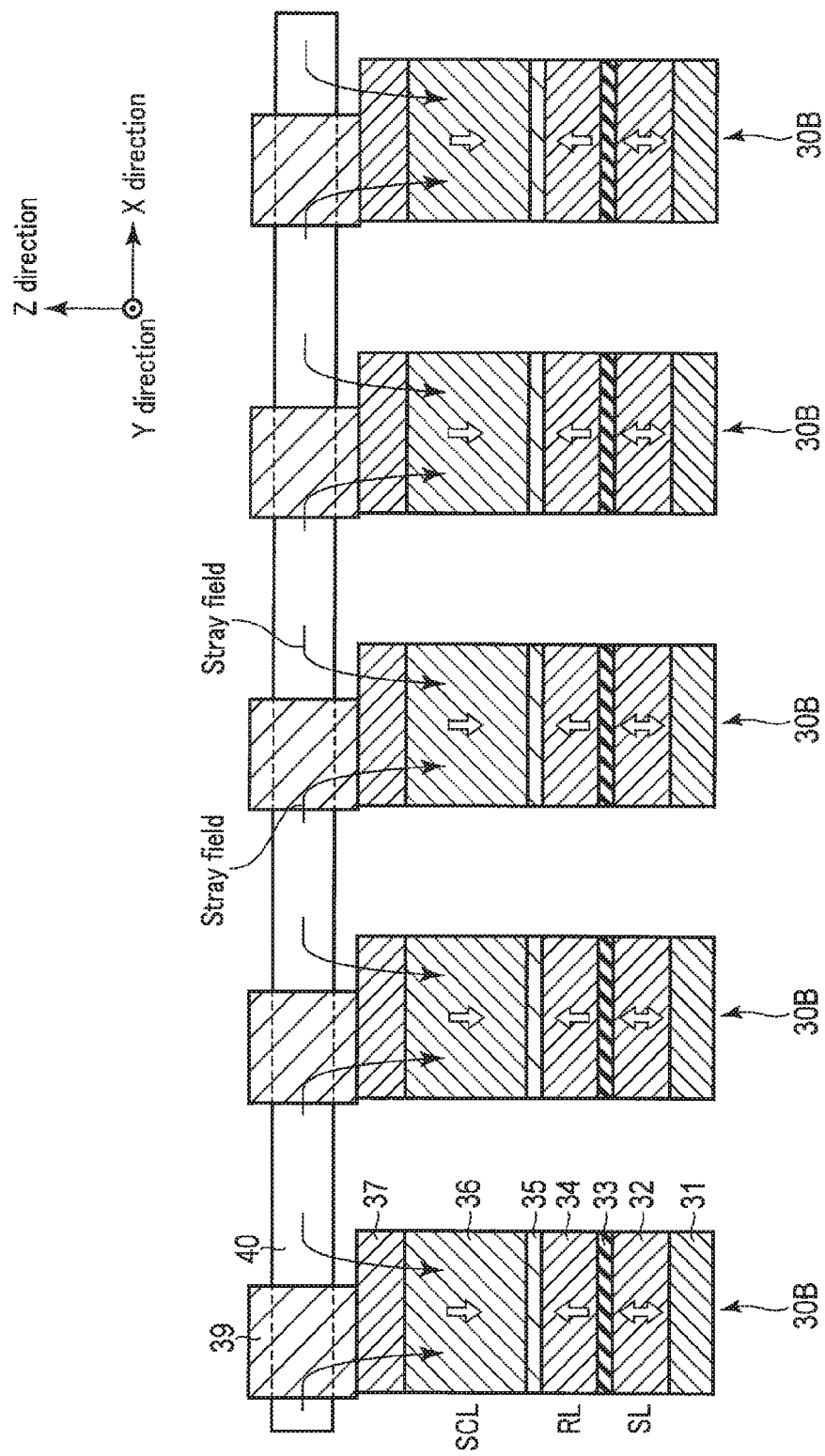
F I G. 16

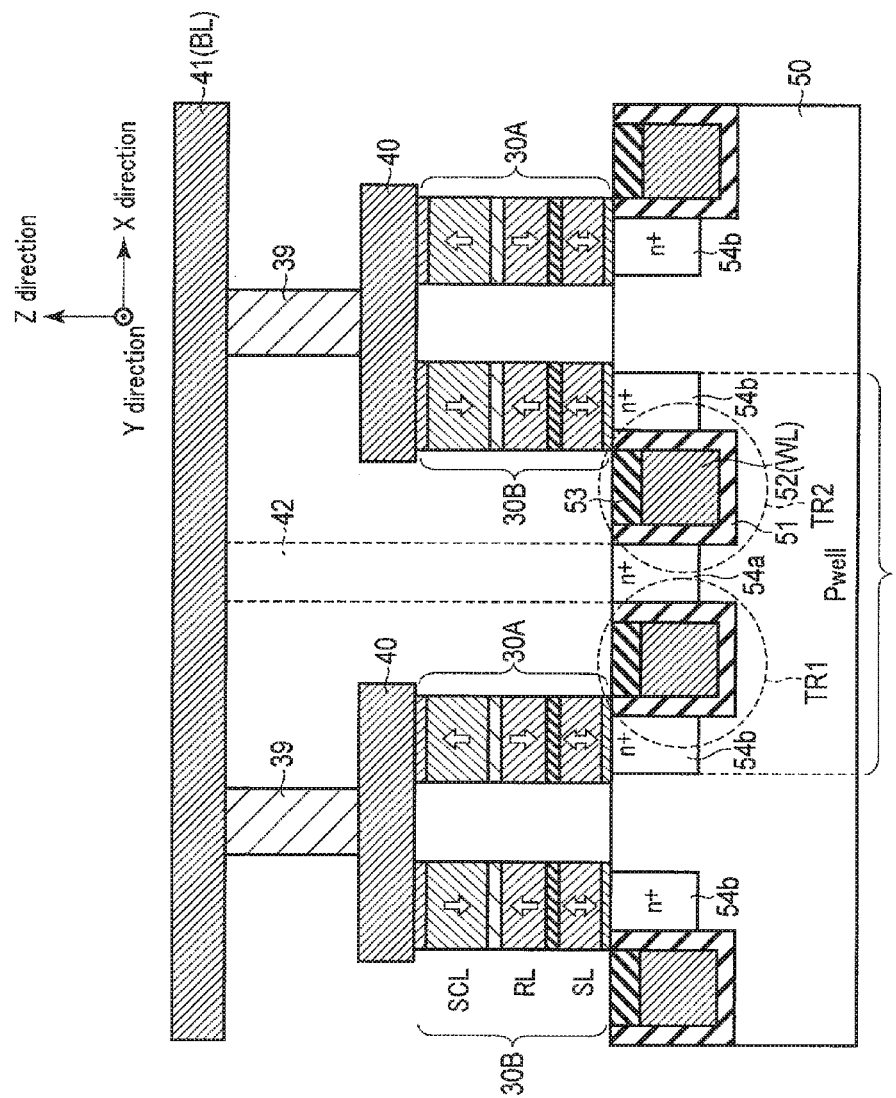
F I G. 20

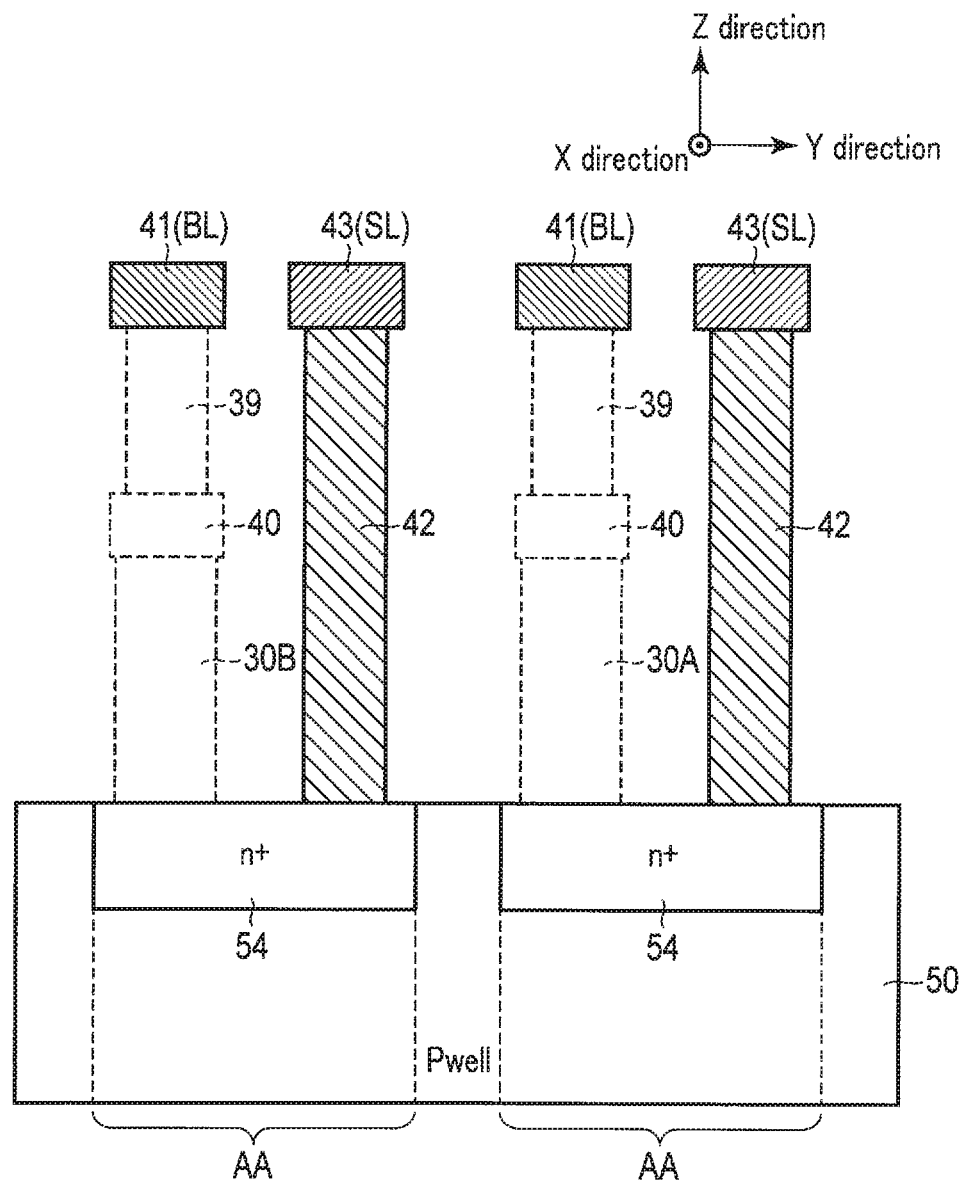
F I G. 21

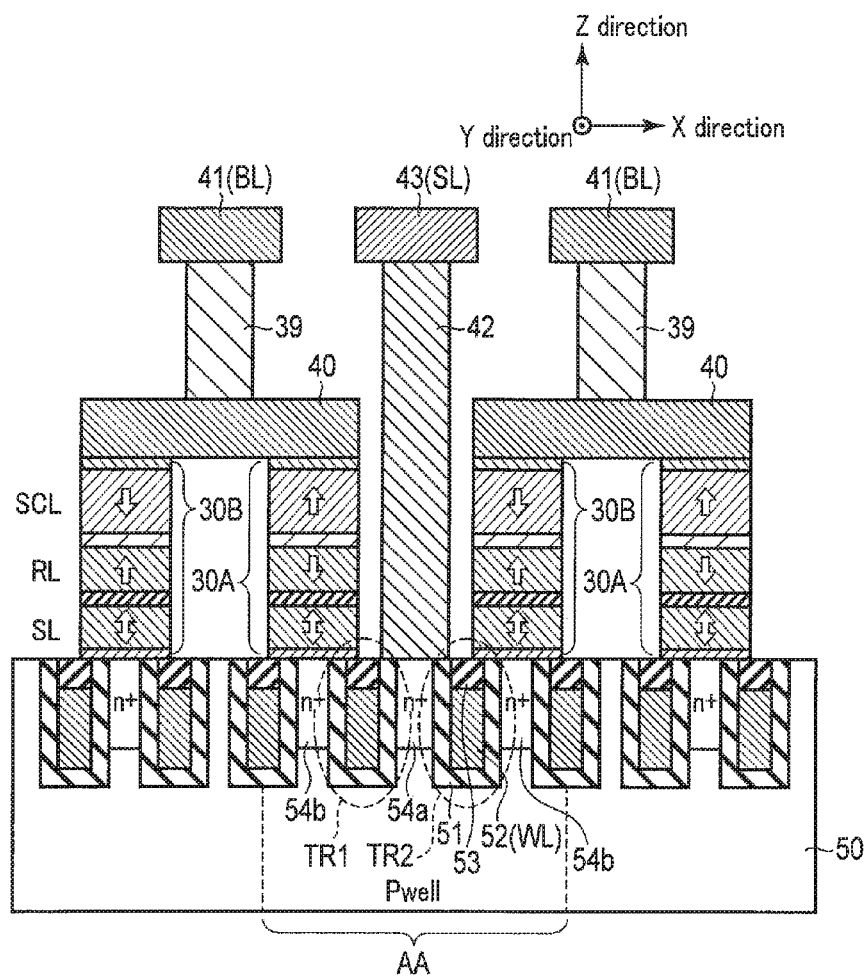
F I G. 23

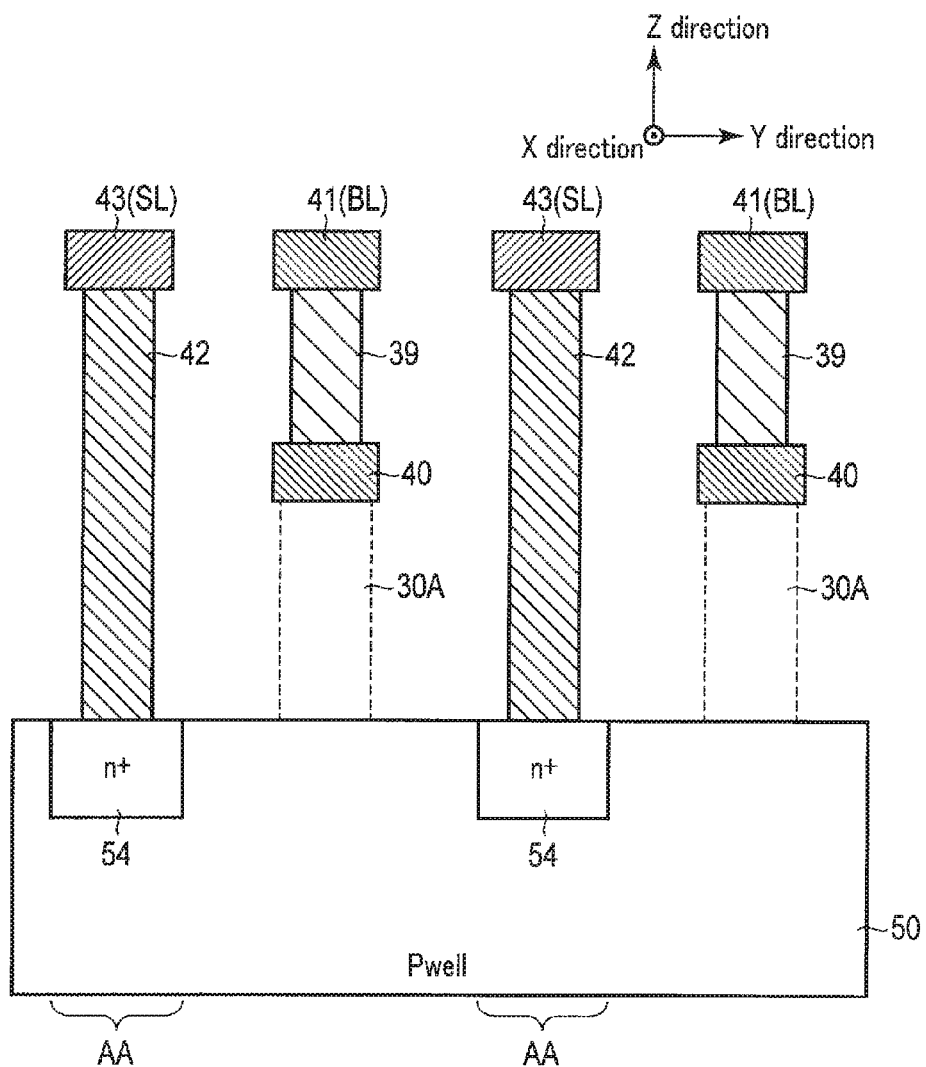
F I G. 24

MAGNETIC MEMORY DEVICE

CROSS-REFERENCE TO RELATED APPLICATIONS

This application claims the benefit of U.S. Provisional Application No. 62/305,481, filed Mar. 8, 2016, the entire contents of which are incorporated herein by reference.

FIELD

Embodiments described herein relate generally to a magnetic memory device.

BACKGROUND

Resistance change memory is known as a type of a semiconductor memory device. As a type of resistance change memory, MRAM (magnetoresistive random access memory) is known. MRAM is characterized by its high-speed operation, large capacity, and non-volatility. MRAM is viewed as a next-generation memory device that replaces volatile memory such as DRAM and SRAM, and much effort has been made to research and develop MRAM.

For MRAM, magnetoresistive elements utilizing a TMR (tunneling magnetoresistive) effect are used as memory cells that store information. As magnetoresistive elements, MTJ (magnetic tunnel junction) elements are used which have a stack of a metal magnetic film/an insulating film/a metal magnetic film. A change in the resistance of the MTJ element depends on a magnetization state of the metal magnetic films which sandwich the insulating film therebetween. In other words, MRAM stores data depending on the magnetization state of the MTJ element.

As MRAM is increasingly miniaturized, the distance between adjacent MTJ elements decreases. Therefore, the characteristics of the adjacent MTJ elements are degraded or vary under the effect of stray fields. Thus, to achieve a high data holding characteristic and to reduce inappropriate operations, MRAM needs to be improved to reduce the adverse effects of stray fields from the MTJ elements.

BRIEF DESCRIPTION OF THE DRAWINGS

FIG. 1 is a block diagram depicting a configuration of a semiconductor memory device according to a first embodiment;

FIG. 11 is a plan layout diagram of MTJ elements in a cell array according to a fourth embodiment;

FIG. 14 is a plan layout diagram of MTJ elements in a cell array according to a fifth embodiment;

FIG. 15 is a sectional view taken along line 15-15 in FIG. 14;

FIG. 16 is a plan layout diagram of the MTJ elements in the cell array according to the fifth embodiment;

FIG. 20 is a sectional view taken along line 20-20 in FIG. 19;

FIG. 21 is a sectional view taken along line 21-21 in FIG. 19;

FIG. 23 is a sectional view taken along line 23-23 in FIG. 22; and

FIG. 24 is a sectional view taken along line 24-24 in FIG. 22.

DETAILED DESCRIPTION

Figure 2:
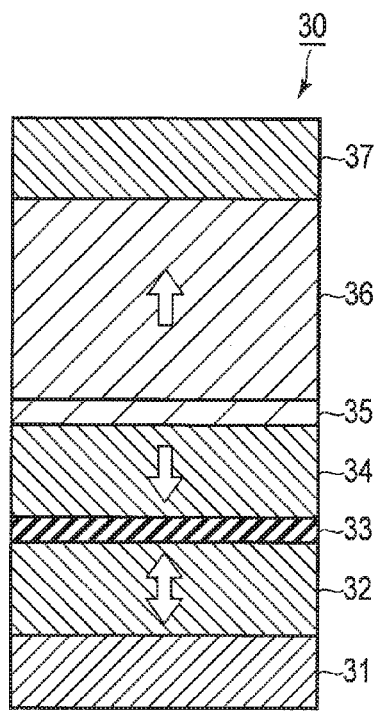
FIGS. 2 to 4 are sectional views of an MTJ element included in a semiconductor memory device according to a first embodiment.

In general, according to one embodiment, a magnetic memory device includes a first magnetoresistive element and a second magnetoresistive element which are adjacent to each other. Each of the first and second magnetoresistive elements includes a first magnetic layer, a first non-magnetic later on the first magnetic layer, a second magnetic layer on the first non-magnetic layer, a second non-magnetic layer on the second magnetic layer, and a third magnetic layer on the second non-magnetic layer. Furthermore, the magnetic memory device further includes a fourth magnetic layer being in contact with the first and second magnetoresistive elements or in contact with conductive layers on the first and second magnetoresistive elements. The third magnetic layer in the first and second magnetoresistive elements are provided between the first magnetic layer and the fourth magnetic layer. A thickness of the third magnetic layer is thicker than a thickness of the first magnetic layer.

Embodiments will be described below with reference to the drawings. In the description below, components with substantially the same functions and configurations are denoted by the same reference numerals. "Letters" each succeeding a number included in a reference numeral and numbers each succeeding a symbol included in a reference numeral are referenced by reference numerals with the same number or symbol and used to distinguish elements with similar configurations from one another. If elements denoted by reference numerals including the same number need not be distinguished from one another, the elements are referenced by a reference numeral including only the number or symbol.

The drawings are schematic. The embodiments illustrate apparatuses and methods for embodying technical concepts of the embodiments. The technical concepts of the embodiments do not limit the materials, shapes, structures, arrangements, and the like of components to those described below.

[1] First Embodiment

A magnetic random access memory (MRAM) according to a first embodiment will be described taking a spin transfer writing MRAM as an example.

[1-1] General Configuration

First, a general configuration of an MRAM 1 according to a first embodiment will be described using FIG. 1.

As depicted in FIG. 1, the MRAM 1 includes a cell array 10, controller 11, an address command circuit 12, a row decoder 13, a word line driver 14, a column decoder 15, a bit line controller 16, a sense amplifier write driver 17, an internal voltage generator 18, and a data I/O (DQ) circuit 19.

The cell array 10 includes a plurality of memory cells MC arranged in a matrix. Each of the memory cells MC includes an MTJ element 30 and a cell transistor TR. The MTJ element 30 is a variable resistance element utilizing a TMR (Tunneling magnetoresistive) effect and can take one of a high resistance state and a low resistance state. The MTJ element 30, for example, stores 1-bit data because the high resistance state and the low resistance state are defined as data "1" and data "0", respectively. The cell transistor TR is used to select from the memory cells MC and is configured to be turned on to pass a current through the corresponding MTJ element 30.

Furthermore, the cell array 10 is provided with a plurality of word lines WL and a plurality of bit line pairs in order to control voltages applied to the memory cells MC. In the present embodiment, one bit line of the bit line pair is denoted by a bit line BL, and the other bit line is denoted by a source line SL. A plurality of the word lines WL is arranged, for example, along a row direction. A plurality of the bit line pairs are arranged, for example, along a column direction orthogonal to the row direction. The memory cell MC is provided at an intersection point between the corresponding word line WL and the corresponding bit line pair. Specifically, the MTJ element 30 and the cell transistor TR in each memory cell MC are connected together in series between the bit lines of the bit line pair. The word line WL is connected to a gate of the corresponding cell transistor TR. In FIG. 1, one end of the MTJ element 30 is connected to the corresponding bit line BL. However, the present invention is not limited to this, and one end of the MTJ element 30 may be connected to the corresponding source line SL.

The controller 11 controls, for example, the address command circuit 12, the internal voltage generator 18, and the DQ circuit 19 in accordance with circuit operation modes such as read, write, refresh, and code correction based on various control signals received from an external controller (not depicted in the drawings). The various control signals include, for example, a chip select signal CS, a clock signal CK, and a clock enable signal CKE.

An address signal CA from the external controller is input to the address command circuit 12. Then, based on the control of the controller 11, a row address contained in the address signal CA is sent to the row decoder 13. A column address contained in the address signal CA is sent to the column decoder 15.

The row decoder 13 decodes the row address received from the address command circuit 12, and controls the word line driver 14 based on this decode result.

The word line driver 14 selects one of the word lines WL based on the control of the row decoder 13, and applies desired voltages to the selected word line WL and unselected word lines WL, respectively.

The column decoder 15 decodes the column address received from the address command circuit 12, and controls the bit line controller 16 based on this decode result.

The bit line controller 16 selects one of the bit lines BL and one of the source lines SL based on the control of the column decoder 15.

The sense amplifier write driver 17 connects to the bit lines BL and the source lines SL via the bit line controller 16. During a read operation, the sense amplifier write driver 17 senses the potential of the relevant bit line BL to determine data stored in the selected memory cell MC. During a write operation, the sense amplifier write driver 17 writes data to the selected memory cell MC by passing a current through the memory cell MC from the bit line BL side or the source line SL side in accordance with write data received from the DQ circuit 19.

The internal voltage generator 18 generates voltages corresponding to the operation modes based on the control of the controller 11, and supplies the voltages to the cell array 10, the word line driver 14, and the sense amplifier write driver 17. Consequently, voltages needed for various operations are applied to the bit lines BL, the source lines SL, and the word lines WL, respectively.

The DQ circuit 19 transmits and receives data to and from the external controller. Write data input from the external controller to the DQ circuit 19 is sent to the sense amplifier write driver 17 via a data bus 20. Read data read from the selected memory cell by the sense amplifier write driver 17 is sent to the DQ circuit 19 via the data bus 20 and output to the exterior through the DQ circuit 19.

[1-2] Configuration of the MTJ Element 30

Now, the configuration of the MTJ element 30 will be described using FIG. 2.

As depicted in FIG. 2, the MTJ element 30 includes a lower electrode 31, a storage layer 32 (SL), an intermediate layer 33, a reference layer 34 (RL), a coupling layer 35, a shift control layer 36 (SCL), and an upper electrode 37 which are stacked in this order from the bottom to top of the MTJ element 30. In FIG. 2, arrows depicted in the storage layer 32, the reference layer 34, and the shift control layer 36 indicate magnetization directions in the respective layers.

The storage layer 32 and the reference layer 34 are perpendicular magnetization films formed using a ferromagnetic material and having magnetic anisotropy which is parallel to a stacking direction. The storage layer 32 has a lower coercive force than the reference layer 34. A resistance value for the MTJ element 30 varies depending on the magnetization directions in the storage layer 32 and the reference layer 34. When the magnetization directions in the storage layer 32 and the reference layer 34 are parallel to each other, the MTJ element 30 is in a low resistance state. When the magnetization directions in the storage layer 32 and the reference layer 34 are antiparallel to each other, the MTJ element 30 is in a high resistance state.

A magnetization inversion current in the reference layer 34 is sufficiently larger than a magnetization inversion current in the storage layer 32. Consequently, the magnetization direction in the storage layer 32 is variable with respect to a predetermined write current. The magnetization direction in the reference layer 34 is invariable with respect to a predetermined write current. A read current is set to a value sufficiently smaller than the value of the magnetization inversion current in the storage layer 32.

The magnetization directions in the storage layer 32 and the reference layer 34 are parallel to each other when the write current is passed in a direction from the reference layer 34 to the storage layer 32. The magnetization directions in the storage layer 32 and the reference layer 34 are antiparallel to each other when the write current is passed in a direction from the storage layer 32 to the reference layer 34. In this manner, the resistance state of the MTJ element 30 can be transitioned between the low resistance state and the high resistance state by changing the direction of the current passed through the MTJ element 30.

The intermediate layer 33 is formed using a non-magnetic layer, and a non-magnetic metal, non-magnetic semiconductor, an insulator, or the like is used as the intermediate layer 33. When an insulator is used as the intermediate layer 33, the intermediate layer 33 is referred to as a tunnel barrier layer. When a metal is used as the intermediate layer 33, the intermediate layer 33 is referred to as a spacer layer.

The shift control layer 36 is a perpendicular magnetization film formed using a ferromagnetic material and having magnetic anisotropy which is parallel to the stacking direction. The shift control layer 36 suppresses stray fields applied from the reference layer 34 to the storage layer 32. The shift control layer 36 has a higher coersive force then the reference layer 34. Moreover, a thickness of the third magnetic layer is thicker than a thickness of the first magnetic layer.

The coupling layer 35 is formed using a non-magnetic material, and for example, ruthenium (Ru) is used as the coupling layer 35. The reference layer 34 and the shift control layer 36, which sandwich the coupling layer 35 therebetween, have magnetization directions made antiparallel to each other utilizing antiferromagnetic coupling performed by the coupling layer 35. Such a structure is referred to as an SAF (synthetic antiferromagnetic) structure.

The lower electrode 31 and the upper electrode 37 are each formed using a metal material, and a non-magnetic metal, a non-magnetic semiconductor, or the like is used as each of the electrodes.

Figure 3:
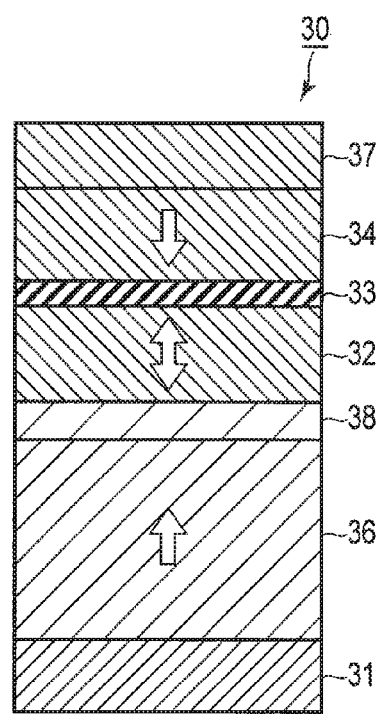

Furthermore, the stack structure of the MTJ element 30 is not limited to this but may be in various forms. For example, a structure may be used in which the shift control layer 36 is arranged below the storage layer 32 as depicted in FIG. 3. In this case, the MTJ element 30 includes the lower electrode 31, the shift control layer 36, a spacer layer 38, the storage layer 32, the intermediate layer 33, the reference layer 34, and the upper electrode 37 which are stacked in this order from the bottom to top of the MTJ element 30.

Figure 4:
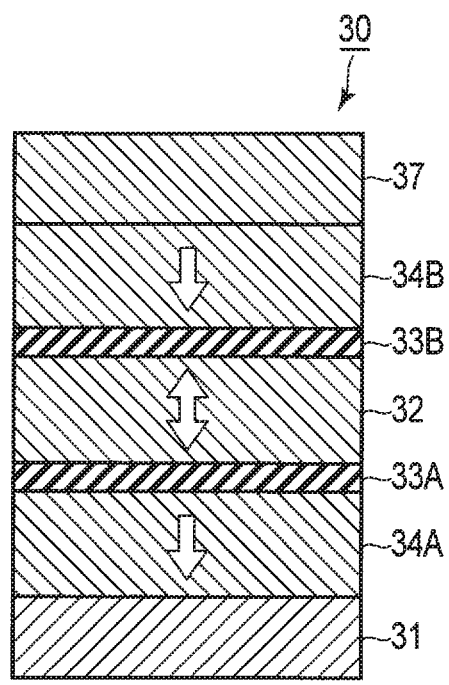

Furthermore, the stack structure of the MTJ element 30 may be such that the storage layer 32 is sandwiched between two reference layers 34 as depicted in FIG. 4. In this case, the MTJ element 30 includes the lower electrode 31, a first reference layer 34A, a first intermediate layer 33A, the storage layer 32, a second intermediate layer 33B, a second reference layer 34B, and the upper electrode 37 which are stacked in this order from the bottom to top of the MTJ element 30. In the present structure, a stray field in each of the MTJ elements is canceled by the first and second reference layers 34A, 34B. In other words, one of the reference layers 34 is considered to act as a shift control layer. The coupling layer and the shift control layer may be provided either between the lower electrode 31 and the first reference layer 34A or between the upper electrode 37 and the second reference layer 34B.

[1-3] Configuration and Layout of the Cell Array 10

Figure 5:
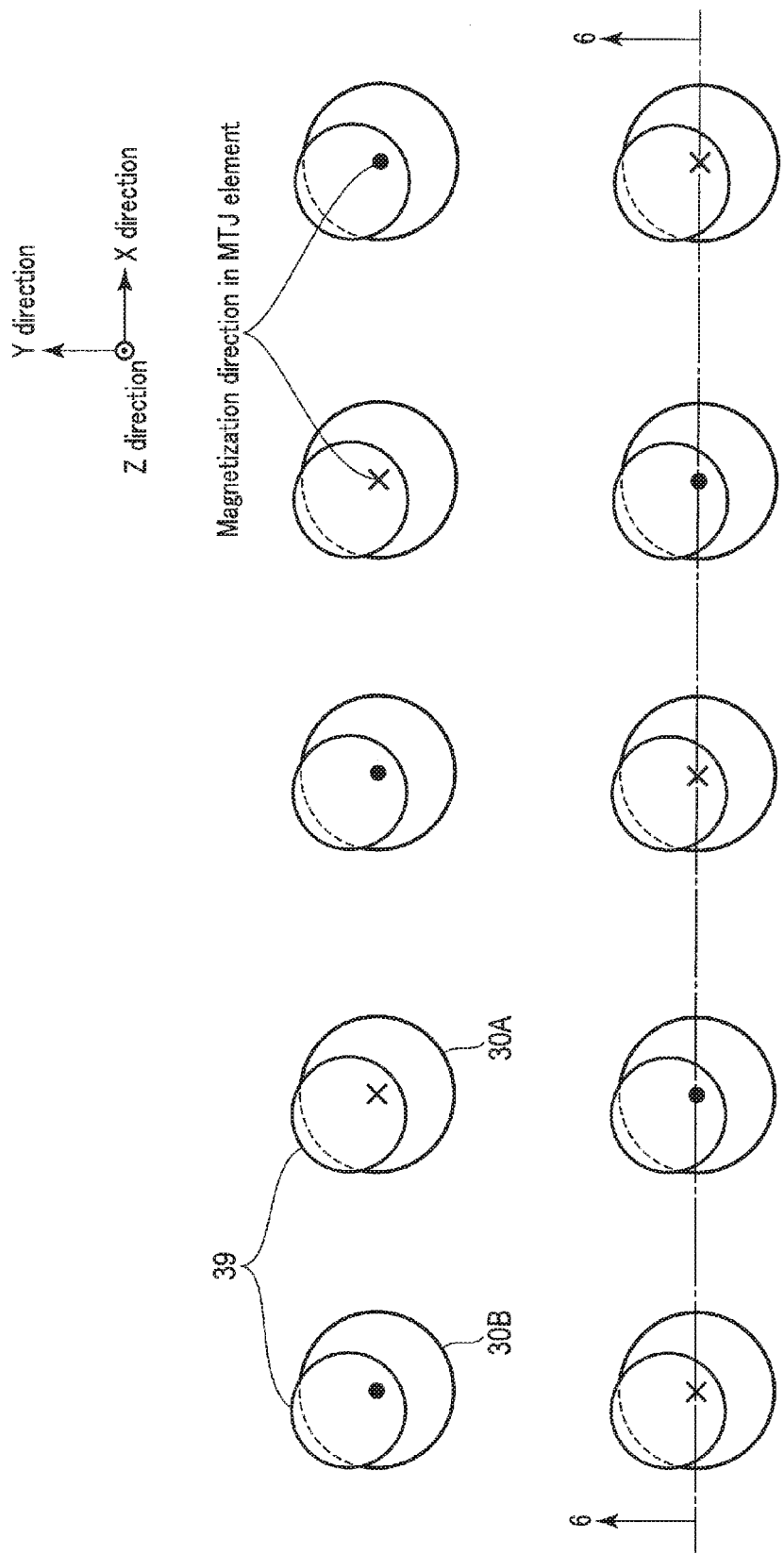
FIG. 5 is a plan layout diagram of MTJ elements in a cell array according to the first embodiment.
Figure 6:
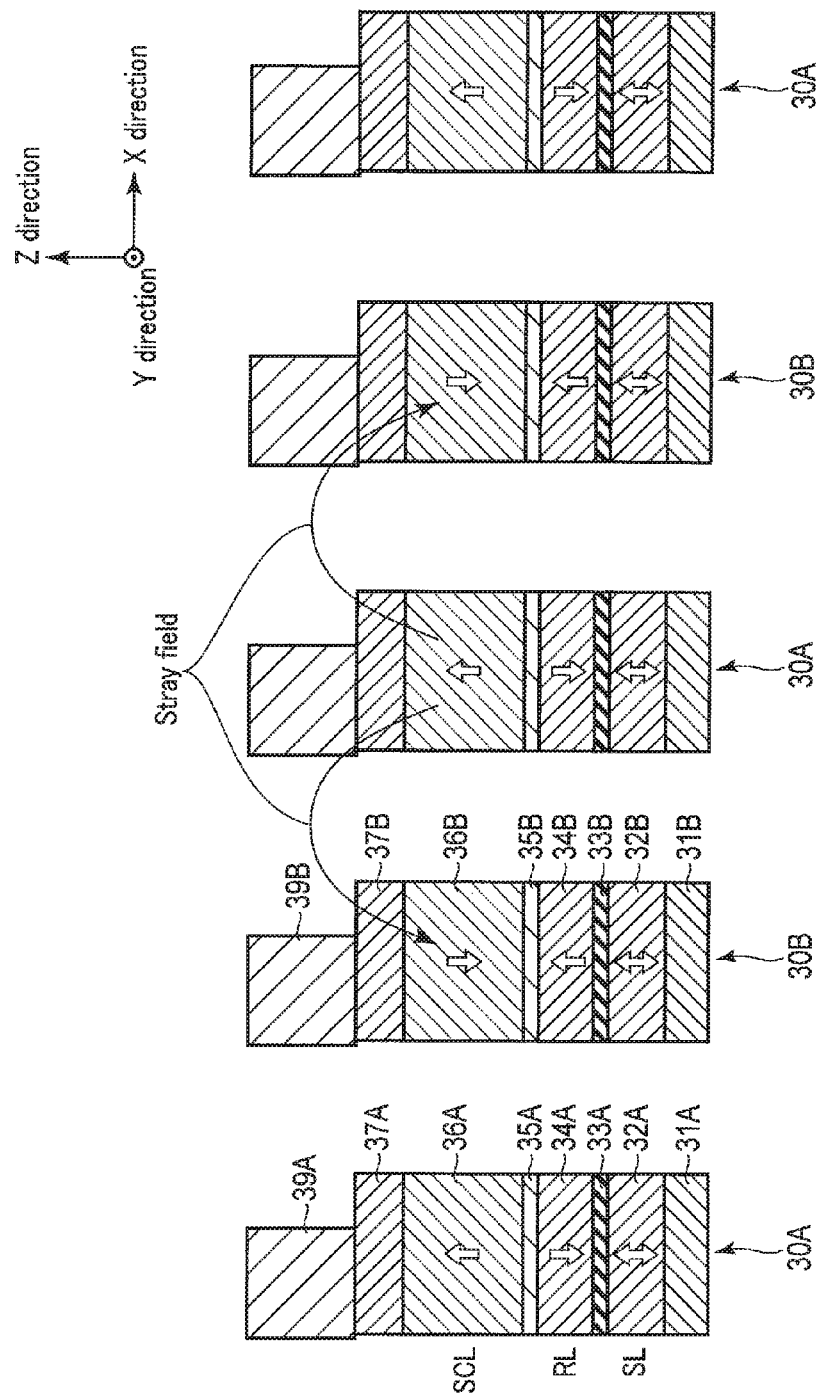
FIG. 6 is a sectional view taken along line 6-6 in FIG. 5.

Now, the configuration and layout of the cell array 10 will be described using FIG. 5 and FIG. 6. FIG. 5 is a plan layout diagram of the MTJ element in the MTJ element in the cell array 10 and also depicts a contact plug formed on the MTJ element. FIG. 6 is a sectional view taken along line 6-6 in FIG. 5 and depicts a part of stray fields generated in the shift control layers 36.

As depicted in FIG. 5, in the cell array 10, a plurality of MTJ elements 30 are arranged in a matrix. MTJ elements 30 which are adjacent to each other in an X direction have respective antiparallel magnetization directions. Moreover, MTJ elements 30 which are adjacent to each other in a Y direction orthogonal to the X direction have respective antiparallel magnetization directions. In this case, the magnetization direction of the MTJ element 30 refers to the magnetization direction of the reference layer 34. For convenience of description, the MTJ element 30 in which the reference layer 34 has a magnetization direction toward the storage layer 32 (this direction is denoted by crosses in FIG. 5) is referred to a MTJ element 30A. The MTJ elements 30B in which the reference layer 34 has a magnetization direction away from the storage layer 32 (this direction is denoted by filled circles in FIG. 5).

A contact plug 39 is provided on each of the MTJ elements 30. The contact plug 39 is formed using a conductive material, and a non-magnetic metal, a non-magnetic semiconductor, or the like is used as the contact plug 39. The MTJ element 30 and the bit line BL are connected together by the contact plug 39.

As depicted in FIG. 6, a Z direction orthogonal to the X direction and the Y direction corresponds to the stacking direction in each MTJ element 30. The contact plug 39 is provided on the upper electrode 37 of each MTJ element 30. The shift control layer 36A in the MTJ element 30A is antiparallel to the shift control layer 36B in the MTJ element 30B. As a result, a line of magnetic force of a magnetic field traveling from the shift control layer 36A toward the upper electrode 37A side enters the shift control layer 36 in the adjacent MTJ element 30B through the upper electrode 37B therein. Thus, a stray field as illustrated is formed. FIG. 6 illustrates the condition of stray fields between the adjacent MTJ elements in the X direction. However, this also applies to the adjacent MTJ elements in the Y direction.

The SAF structure is preferably used to alternate the magnetization directions between the adjacent MTJ elements 30 as described above. Moreover, the coersive force of the shift control layer 36 in each MTJ element 30 may be adjusted. In this case, the adjacent MTJ elements are set to have different coersive forces to vary the easiness of change in magnetization direction between one of the MTJ elements and the other MTJ element. Consequently, application of an external magnetic field enables the magnetization directions between the adjacent MTJ elements to be alternated.

Furthermore, the MTJ elements 30A and 30B have different magnetization directions and may thus have different cell characteristics. In this regard, the controller 11 changes applied voltages, time for sensing, and the like according to the addresses of a write target and a read target to suppress variations in write results and read results.

[1-4] Effects of the First Embodiment

The first embodiment allows reliability of the MRAM to be improved. Effects of the present embodiment will be described below.

The MRAM has an increased storage capacity through advanced miniaturization. However, as the distance between the adjacent MTJ elements decreases with progression of miniaturization, the adverse effects of a stray field from each MTJ element on the adjacent MTJ element may be non-negligible. Specifically, when the shift control layers in the adjacent MTJ elements have the same magnetization direction, a magnetic field generated by the shift control layer in one of the MTJ elements may affect the storage layer in the adjacent MTJ element to change the magnetic characteristics of the adjacent MTJ element. For example, information retention characteristics of the storage layer or the reference layer may be degraded.

Thus, in the MRAM 1 according to the first embodiment, the adjacent MTJ elements 30 have the respective antiparallel magnetization directions. Then, as depicted in FIG. 6, a line of magnetic force of a magnetic field generated by the shift control layer 36A enters the other shift control layer 36B and is closed in a loop form between the adjacent MTJ elements. That is, the stray fields generated by the shift control layers 36A, 36B in the respective adjacent MTJ elements 30 form a closed loop structure. Furthermore, between the adjacent MTJ elements, the magnetic field generated by the MTJ element 30A offsets the magnetic field generated by the other MTJ element 30B.

Thus, the stray field generated by the shift control layer 36 in the MTJ element 30 is unlikely to affect the characteristics of other areas in the MTJ element 30 such as the storage layer 32 and the reference layer 34. As a result, the MRAM 1 according to the first embodiment enables changes in the characteristics of the MTJ elements 30 to be suppressed, allowing stabilization of memory operations such as write, read, and data retention characteristics to be enhanced.

Although the magnetization directions in the MTJ elements 30 disposed in a matrix are alternated in the X direction and in the Y direction, the present invention is not limited to this. For example, the magnetization directions in the MTJ elements 30 may be alternated exclusively in the X direction or in the Y direction.

[2] Second Embodiment

Now, an MRAM according to a second embodiment will be described. The second embodiment is the above-described first embodiment in which a yoke is provided between MTJ elements having the respective antiparallel magnetization directions and arranged adjacently to each other. A configuration of the MRAM according to the second embodiment will be described below in terms of differences from the first embodiment.

[2-1] Configuration and Layout of the Cell Array 10

Figure 7:
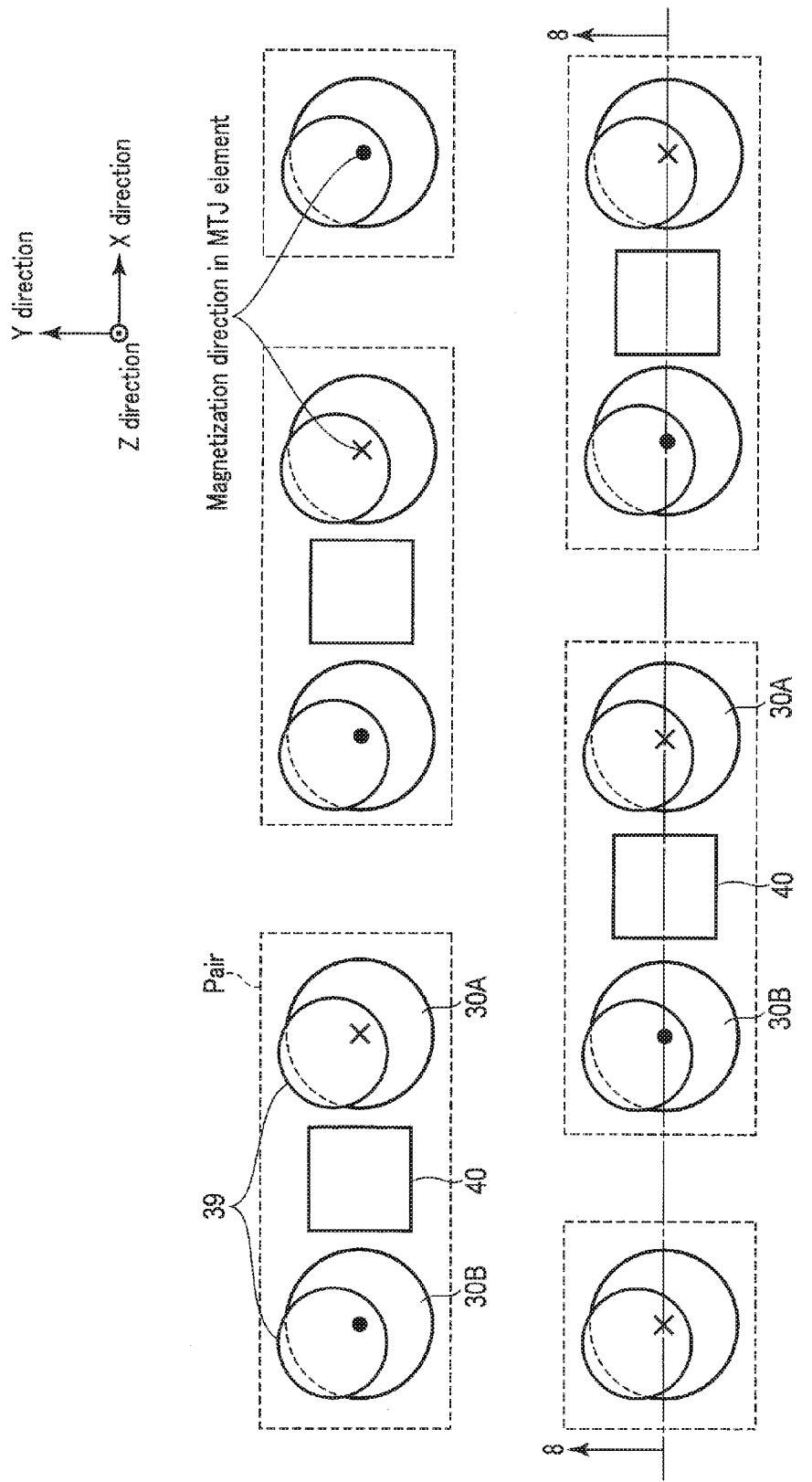
FIG. 7 is a plan layout diagram of MTJ elements in a cell array according to a second embodiment.
Figure 8:
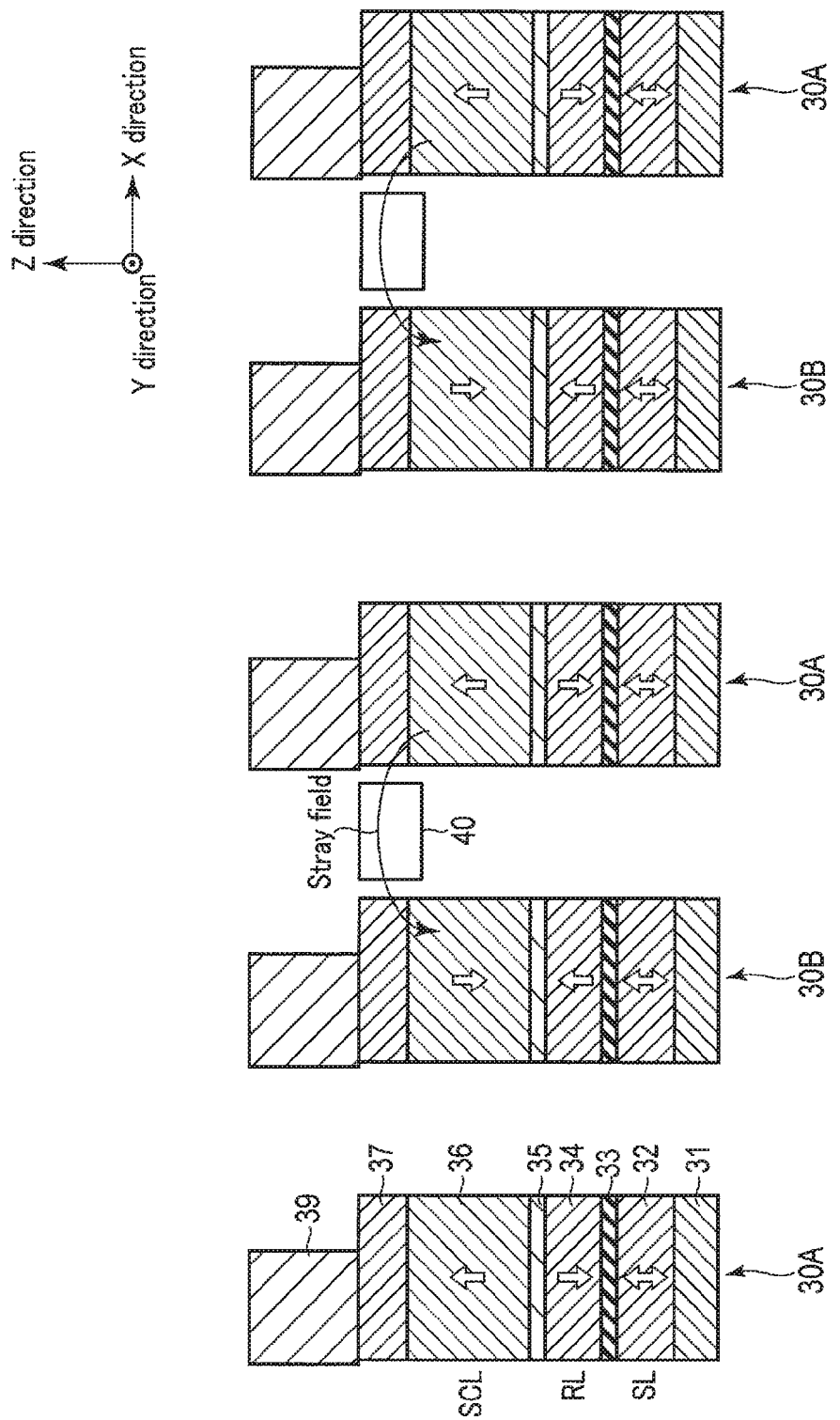
FIG. 8 is a sectional view taken along line 8-8 in FIG. 7.

The configuration and layout of the cell array 10 will be described using FIG. 7 and FIG. 8. FIG. 7 is a plan layout of MTJ elements in the cell array 10. FIG. 8 is a sectional view taken along line 8-8 in FIG. 7 and depicts a part of stray fields generated in the shift control layers 36.

As depicted in FIG. 7, in the cell array 10, the MTJ element 30A and the MTJ element 30B which are adjacent to each other in the X direction form one MTJ pair. In each MTJ pair, a conductive yoke 40 is provided between the MTJ elements 30. The conductive yoke 40 contains a conductive magnetic material having a higher magnetic permeability than a vacuum to concentrate lines of magnetic force of magnetic fields generated by the MTJ elements 30. As the conductive yoke 40, for example, an Ni—Fe alloy, a Co—Fe—Ni alloy, a Co—(Zr, HF, Nb, Ta, Ti) film, or a (Co, Fe, Ni)—(Si, B)—(P, Al, Mo, Nb, Mn)-based amorphous material is used. In the expressions of these materials, expressions in which a plurality of element symbols are described in parentheses indicate that the material is at least one element selected from these elements.

Insulating films are buried between the yoke 40 and each of the MTJ elements 30A, 30B to insulate the yoke 40 from the MTJ elements 30A, 30B. Furthermore, the yoke 40 is not provided between the MTJ pairs adjacent to each other in the X direction or between the MTJ elements 30 adjacent to each other in the Y direction. The areas between the adjacent MTJ pairs in the X direction and between the adjacent MTJ elements in the Y direction are filled with the insulating films. Additionally, the two MTJ elements included in each of the MTJ pairs in FIG. 7 are staggered. However, the present invention is not limited to this, and the MTJ elements need not be staggered. In addition, in FIG. 7, the two adjacent MTJ elements 30 in the X direction are included in the MTJ pair. However, the present invention is not limited to this, and the adjacent MTJ elements 30 in the Y direction may be included in the MTJ pair.

As depicted in FIG. 8, the yoke 40 is provided between upper portions of the MTJ elements 30A, 30B included in the MTJ pair. Specifically, the yoke 40 is provided to extend from an area between the upper electrodes 37A, 37B in the MTJ elements 30 in the MTJ pair to an area between upper portions of the shift control layers 36A, 36B. As a result, a line of magnetic force traveling from the shift control layer 36A toward the upper electrode 37A side enters, through the upper electrode 37B side of the MTJ element 30B forming the pair via the yoke 40, the shift control layer 36B in the MTJ element 30B. Thus, a stray field as illustrated is formed. The remaining parts of the configuration are similar to the corresponding parts in the first embodiment.

The arrangement of the yoke 40 is not limited to this, and various changes may be made to the above-described arrangement. For example, the yoke 40 may be arranged exclusively between the upper electrodes 37A, 37B in the MTJ elements 30 in the MTJ pair or between the shift control layers 36A, 36B in the MTJ elements 30. Furthermore, the yoke 40 is preferably arranged between the MTJ elements 30 in the MTJ pair but may be arranged in a place slightly displaced from the area between the MTJ elements 30 in the MTJ pair.

[2-2] Effects of the Second Embodiment

In the MRAM 1 according to the second embodiment, the MTJ elements 30A, 30B which have the respective antiparallel magnetization directions and which are adjacent to each other form the MTJ pair, and the conductive yoke 40 is provided between the MTJ elements 30A, 30B included in the MTJ pair. As depicted in FIG. 8, a line of magnetic force of a magnetic field generated in the shift control layer 36A in the MTJ element 30A is attracted to the yoke 40 and enters the shift control layer 36B in the MTJ element 30B via the yoke 40. Then, lines of magnetic force decrease in the shift control layers 36A and 36B and outside the yoke 40.

Consequently, compared to the first embodiment, the second embodiment reduces the adverse effects of stray fields generated by the shift control layers 36A, 36B on the characteristics of the storage layer 32, the reference layer 34, and the like. As a result, compared to the MRAM 1 in the first embodiment, the MRAM 1 according to the second embodiment enables changes in the characteristics of the MTJ elements 30 to be suppressed, allowing stabilization of memory operations such as the write, read, and data retention characteristics to be enhanced.

The formation of the MTJ pair of the MTJ elements 30A, 30B is not limited to this. Pairs of the MTJ elements 30 arranged in the X direction may be mixed with pairs of the MTJ elements 30 arranged in the Y direction.

[3] Third Embodiment

Now, an MRAM according to a third embodiment will be described. The present embodiment is the above-described first embodiment in which the yokes are provided between the adjacent MTJ elements in the X direction and between the adjacent MTJ elements in the Y direction. A configuration of the MRAM according to the third embodiment will be described below in terms of differences from the first and second embodiments.

[3-1] Configuration and Layout of the Cell Array 10

Figure 9:
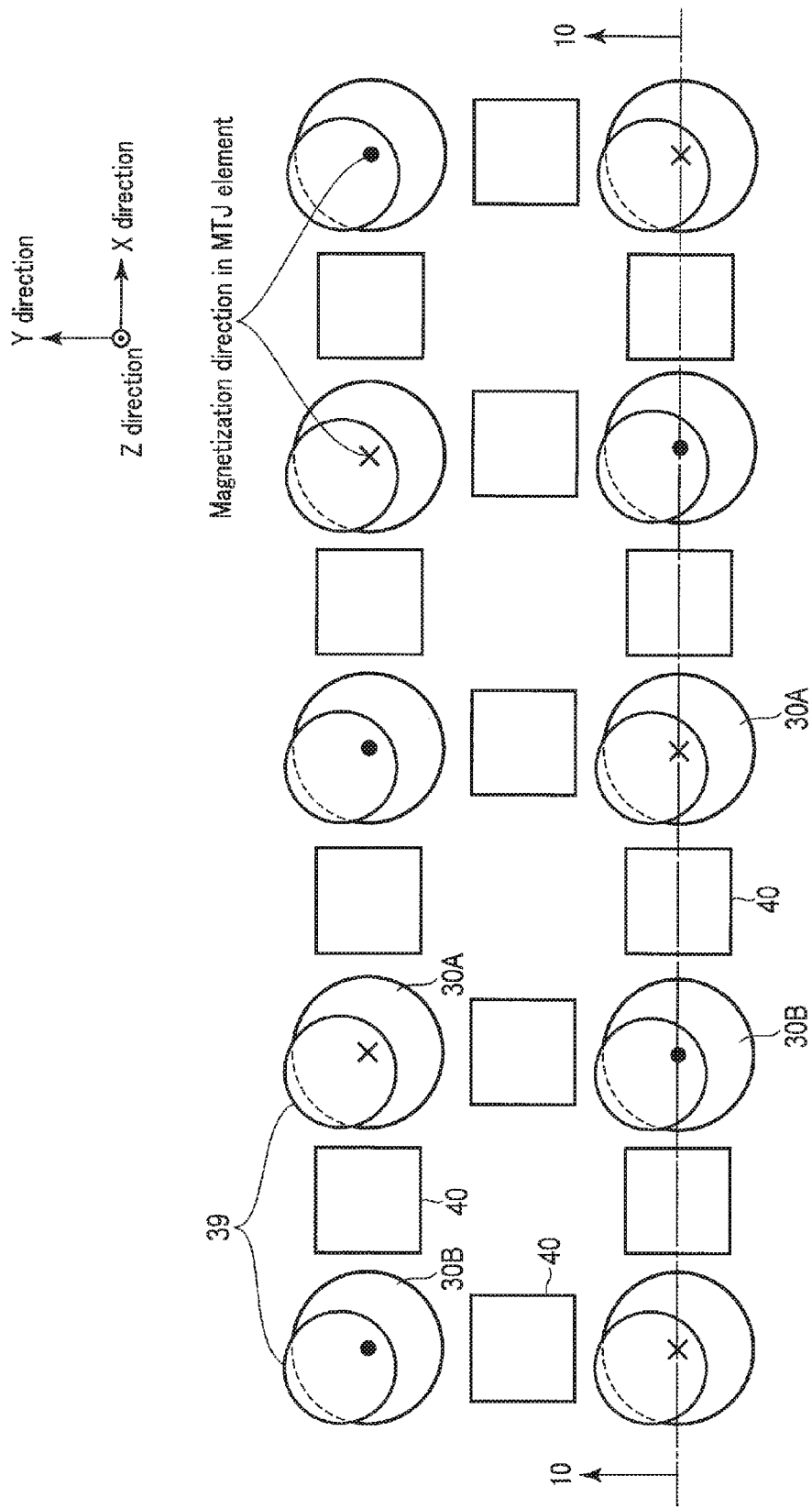
FIG. 9 is a plan layout diagram of MTJ elements in a cell array according to a third embodiment.
Figure 10:
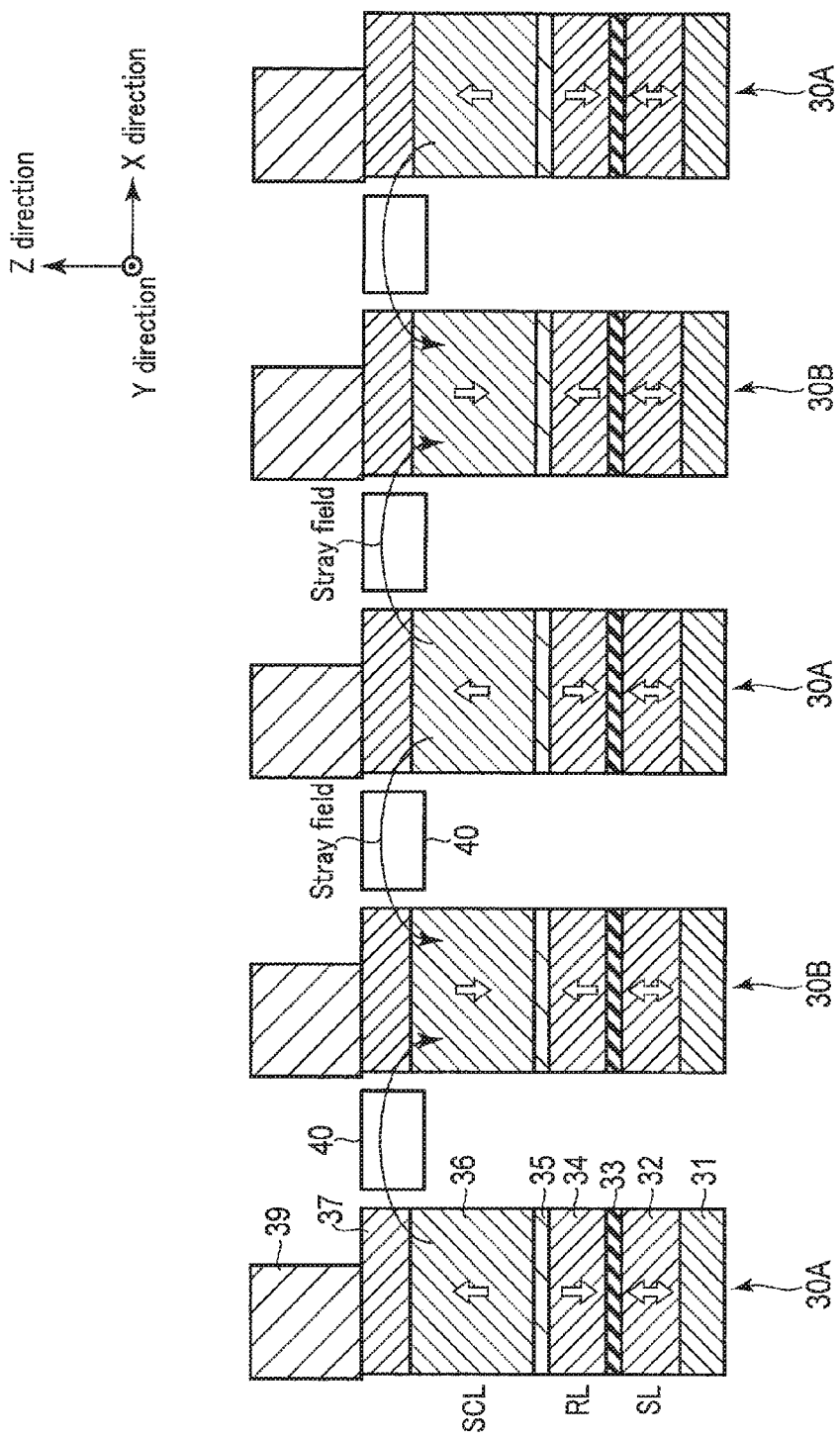
FIG. 10 is a sectional view taken along line 10-10 in FIG. 9.

The configuration and layout of the cell array 10 will be described using FIG. 9 and FIG. 10. FIG. 9 is a plan layout of MTJ elements in the cell array 10. FIG. 10 is a sectional view taken along line 10-10 in FIG. 9 and depicts a part of stray fields generated in the shift control layers 36.

As depicted in FIG. 9, in the cell array 10, the yokes 40 are provided between the adjacent MTJ elements 30A, 30B in the X direction and between the adjacent MTJ elements 30A, 30B in the Y direction. In other words, this configuration corresponds to the configuration described in the first embodiment in which the yokes 40 are provided between the adjacent MTJ elements in the X direction and between the adjacent MTJ elements in the Y direction.

Moreover, in other words, this configuration corresponds to the configuration described in the second embodiment in which the yoke 40 is provided between the adjacent MTJ elements in the Y direction and in which the yoke 40 is also provided between the MTJ elements which belong to a different MTJ pair and which are adjacent to each other in the X direction.

As depicted in FIG. 10, the yoke 40 is provided between the upper portions of the MTJ elements 30A, 30B in the X direction. Consequently, a line of magnetic force traveling from the shift control layer 36A in the MTJ element 30A toward the upper electrode 37A side enters, through the upper electrode 37B side of the MTJ element 30B adjacent to the MTJ element 30A via the yoke 40, the shift control layer 36B in the MTJ element 30B. Thus, a stray field as illustrated is formed. The remaining parts of the configuration are similar to the corresponding parts in the first and second embodiments.

As is the case with the second embodiment, the yoke 40 is insulated from the MTJ elements 30A, 30B.

Furthermore, the arrangement of the yoke 40 provided between the adjacent MTJ elements 30A, 30B in the Y direction may be similar to or different from the arrangement of the yoke 40 between the adjacent MTJ elements 30A, 30B in the X direction. For example, the yoke 40 provided between the adjacent MTJ elements 30A, 30B in the Y direction may be installed in a layer above the yoke 40 between the adjacent MTJ elements 30A, 30B in the X direction.

[3-2] Effects of the Third Embodiment

In the MRAM 1 according to the third embodiment, the conductive yoke 40 is provided between the MTJ elements 30 which have the respective antiparallel magnetization directions and which are adjacent to each other. As depicted in FIG. 10, a line of magnetic force of a magnetic field generated by the MTJ element 30A is attracted to the adjacent yoke 40 and enters the adjacent MTJ element 30B via the yoke 40. Then, lines of magnetic force decrease in the shift control layers 36A and 36B and outside the yoke 40.

Consequently, compared to the second embodiment, the third embodiment reduces the adverse effects, on the characteristics of the storage layer 32, the reference layer 34, and the like, of stray fields generated by the shift control layers 36A, 36B in the MTJ elements 30 which have the respective antiparallel magnetization directions and which are adjacent to each other. As a result, compared to the MRAM 1 in the second embodiment, the MRAM 1 according to the third embodiment enables changes in the characteristics of the MTJ elements 30 to be suppressed, allowing stabilization of memory operations such as the write, read, and data retention characteristics to be enhanced.

The arrangement of the yoke 40 is not limited to this, and various changes may be made to the above-described arrangement. For example, the yoke 40 may be omitted from any of the areas between the MTJ elements 30. For example, a configuration is possible in which the yoke 40 is provided exclusively between the MTJ elements 30 in the X direction and is not provided between the MTJ elements 30 in the Y direction. Even such a configuration enables degradation of the characteristics of the MTJ elements 30 to be suppressed.

[4] Fourth Embodiment

Now, an MRAM according to a fourth embodiment will be described. The present embodiment is the above-described second embodiment in which a yoke is provided so as to connect contact plugs on two MTJ elements included in each MTJ pair. A non-conductive material is used as a material for the yoke. A configuration of the MRAM according to the fourth embodiment will be described below in terms of differences from the first to third embodiments.

[4-1] Configuration and Layout of the Cell Array 10

Figure 12:
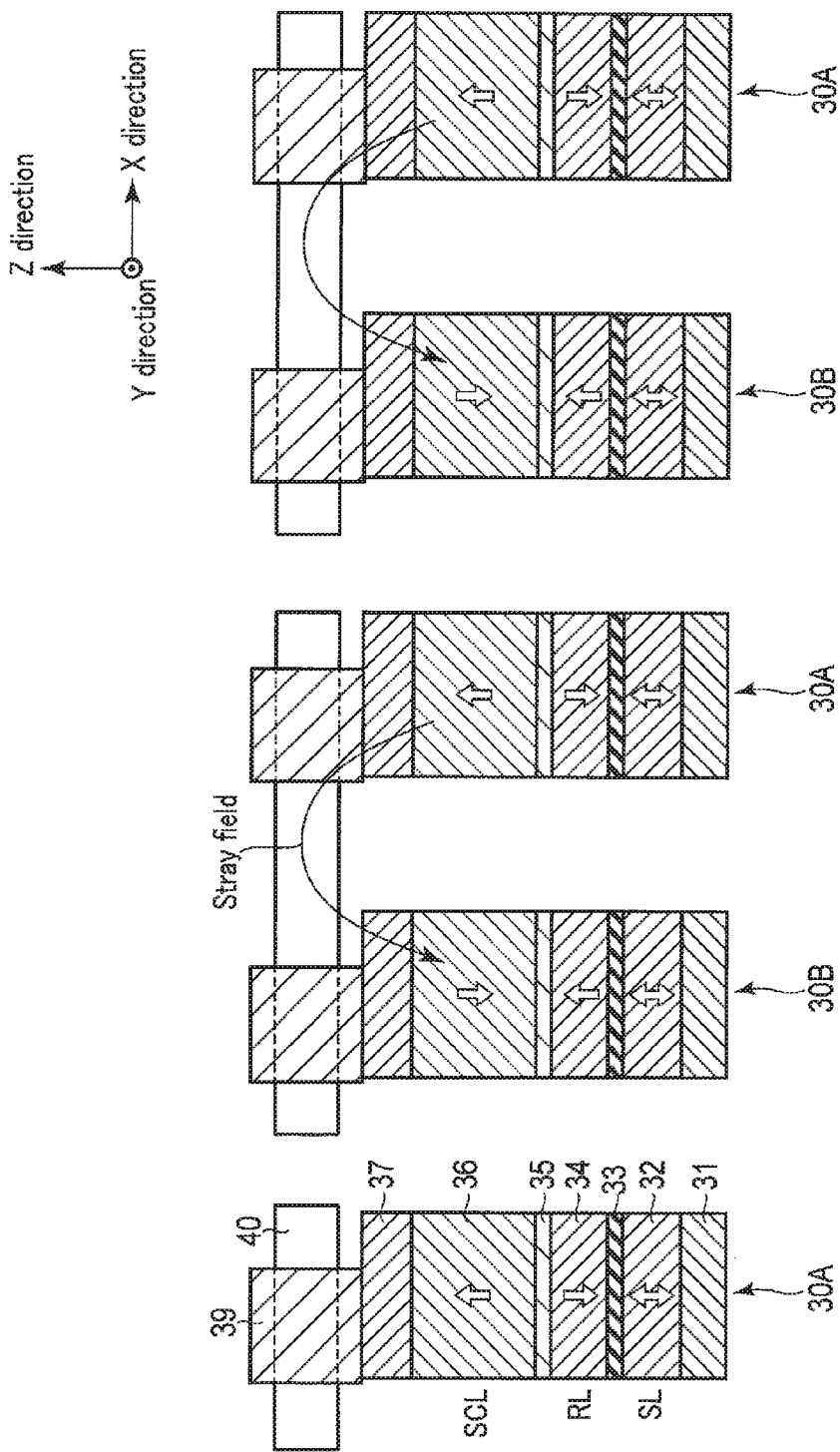
FIG. 12 is a sectional view taken along line 12-12 in FIG. 11.

The configuration and layout of the cell array 10 will be described using FIG. 11 and FIG. 12. FIG. 11 is a plan layout of MTJ elements in the cell array 10. FIG. 12 is a sectional view taken along line 12-12 in FIG. 11 and depicts a part of stray fields generated in the shift control layers 36.

As depicted in FIG. 11, in the cell array 10, the MTJ element 30A and the MTJ element 30B which are adjacent to each other in the X direction form one MTJ pair. In each MTJ pair, the yoke 40 is provided over the MTJ elements 30A and 30B so as to bridge the contact plugs 39 of the MTJ elements 30A and 30B. In other words, yoke 40 is in contact with the MTJ element 30A and the MTJ element 30B in MTJ pair. Furthermore, yoke 40 may be in contact with conductive layers on the MTJ elements 30A and 30B in MTJ pair. Moreover, the shift control layers 36 in the MTJ elements 30A and 30B are provided between the storage layers 32 and the yoke 40.

In the fourth embodiment, the yoke 40 is electrically non-conductive. As the non-conductive yoke 40, for example, insulating ferrite or a metal-nonmetal nanogranular film based on an (Fe, Co)—(B, Si, Hf, Zr, Sm, Ta, Al)—(F, O, N) or the like is used. In the expressions of these materials, expressions in which a plurality of element symbols are described in parentheses indicate that the material is at least one element selected from these elements. The insulating ferrite is at least one material selected from, for example, Mn—Zn-ferrite, Ni—Zn-ferrite, MnFeO, CuFeO, FeO, and NiFeO.

As is the case with the second embodiment, the MTJ elements included in the MTJ pairs in FIG. 11 are staggered. However, the present invention is not limited to this, and the MTJ elements need not be staggered. Furthermore, the adjacent MTJ elements 30 in the Y direction may form an MTJ pair.

As depicted in FIG. 12, the yoke 40 is provided over the MTJ elements 30A, 30B included in the MTJ pair such that the contact plugs 39 pass through the yoke 40. Consequently, a line of magnetic force traveling from the shift control layer 36A in the MTJ element 30A toward the upper electrode 37A side enters, through the upper electrode 37B side of the MTJ element 30B forming the pair via the yoke 40, the shift control layer 36B in the MTJ element 30B. Thus, a stray field as illustrated is formed. The remaining parts of the configuration are similar to the corresponding parts in the first to third embodiments.

A height at which the yoke 40 is provided is not limited to the above-described configuration. The height at which the yoke 40 is provided may be below the contact plugs 39, and more preferably, may be any height above the shift control layers 36 in the MTJ elements 30. Furthermore, in FIG. 12, the contact plugs 39 are provided so as to pass through the yoke 40. However, the present invention is not limited to this. The contact plugs 39 and the yoke 40 may be optionally configured so long as the contact plugs 39 and the yoke 40 partly contact one another. Moreover the contact plugs 39 may not be in contact with the yoke 40.

Figure 13:
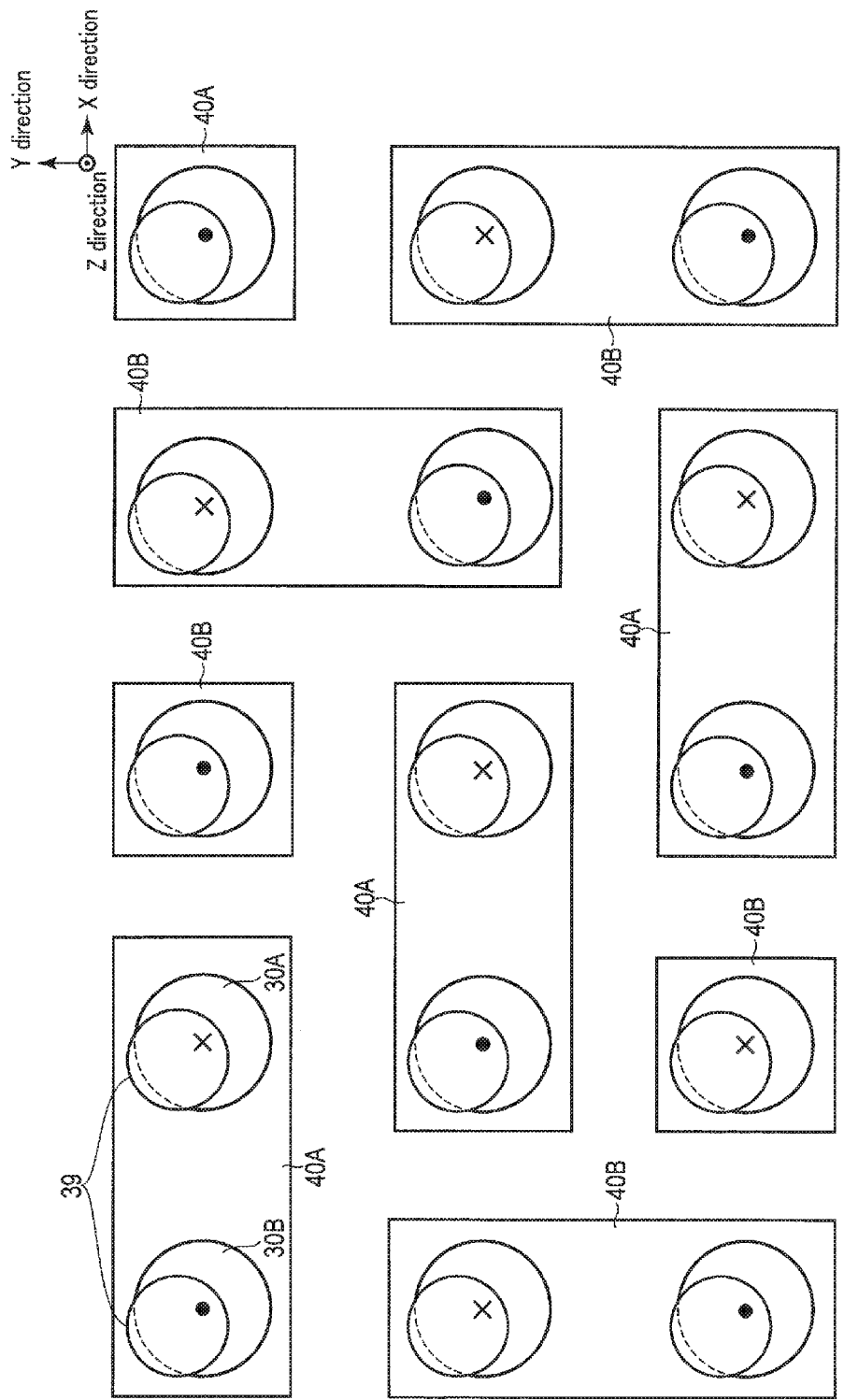
FIG. 13 is a plan layout diagram of the MTJ elements in the cell array according to the fourth embodiment.

Furthermore, as depicted in FIG. 13, the MTJ elements 30 forming pairs in the X direction may be mixed with the MTJ elements 30 forming pairs in the Y direction. Furthermore, the configuration of the MTJ pairs depicted in FIG. 13 corresponds to an example of a case where the pairs of the MTJ elements 30 arranged in the X direction are mixed with the pairs of the MTJ elements 30 arranged in the Y direction as described in the second embodiment.

[4-2] Effects of the Fourth Embodiment

In the MRAM 1 according to the fourth embodiment, the MTJ pairs are each formed of the MTJ elements which have the respective antiparallel magnetization directions and which are adjacent to each other. The non-conductive yokes 40 are provided each of which bridges corresponding ends of the MTJ elements 30 in the MTJ pair. Then, as depicted in FIG. 12, in the MTJ elements 30 included in the MTJ pair, a line of magnetic force of a magnetic field generated in the shift control layer 36A in the MTJ element 30A is attracted to the adjacent yoke 40 and enters the shift control layer 36B in the MTJ element 30B via the yoke 40. Then, lines of magnetic force decrease in the shift control layers 36A and 36B and outside the yoke 40.

This reduces the adverse effects, on the characteristics of the storage layer 32, the reference layer 34, and the like, of stray fields generated by the shift control layers 36A, 36B in the MTJ pair. As a result, as is the case with the first to third embodiments, the MRAM 1 according to the fourth embodiment enables changes in the characteristics of the MTJ elements 30 to be suppressed, allowing stabilization of memory operations such as the write, read, and data retention characteristics to be enhanced.

[5] Fifth Embodiment

Now, an MRAM according to a fifth embodiment will be described. In the fifth embodiment, a non-conductive yoke is provided over a plurality of MTJ elements arranged in a matrix so as to bridge contact plugs on the MTJ elements. A configuration of the MRAM 1 according to the fifth embodiment will be described below in terms of differences from the first to fifth embodiments.

[5-1] Configuration and Layout of the Cell Array 10

The configuration and layout of the cell array 10 will be described using FIG. 14 and FIG. 15. FIG. 14 is a plan layout of MTJ elements in the cell array 10. FIG. 15 is a sectional view taken along line 15-15 in FIG. 14 and depicts a part of stray fields generated in the shift control layers 36.

As depicted in FIG. 14, in the cell array 10, the non-conductive yoke 40 is provided so as to bridge the adjacent MTJ elements 30A, 30B in the X direction and to bridge the adjacent MTJ elements 30A, 30B in the Y direction. The yoke 40 is also provided between obliquely adjacent MTJ elements 30 depicted in FIG. 14.

The non-conductive yoke 40 is provided all over the plurality of MTJ elements 30 arranged in a matrix in FIG. 14. However, the present invention is not limited to this. The yoke 40 may be omitted from any parts of the cell array 10. For example, the yoke 40 may be omitted from the areas between the obliquely adjacent MTJ elements 30.

As depicted in FIG. 15, the yoke 40 is provided so as to pass through the contact plugs 39 on the MTJ elements 30A, 30B arranged in the X direction. Consequently, a line of magnetic force traveling from the shift control layer 36A in the MTJ element 30A toward the upper electrode 37A side enters, through the upper electrode 37B side of the MTJ element 30B adjacent to the MTJ element 30A via the yoke 40, the shift control layer 36B in the MTJ element 30B. Thus, a stray field as illustrated is formed. The remaining parts of the configuration are similar to the corresponding parts in the first to fourth embodiments.

As is the case with the fourth embodiment, the height at which the yoke 40 is provided is not limited to the above-described configuration. The height at which the yoke 40 is provided may be below the contact plugs 39, and more preferably, may be any height above the shift control layers 36 in the MTJ elements 30.

[5-2] Effects of the Fifth Embodiment

The MRAM 1 according to the fifth embodiment includes the non-conductive yoke 40 so as to bridge the contact plugs 39 connected to the plurality of MTJ elements arranged in a matrix. As depicted in FIG. 15, a line of magnetic force of a magnetic field generated in the shift control layer 36A in the MTJ element 30A is attracted to the adjacent yoke 40 and enters the shift control layer 36B in the MTJ element 30B via the yoke 40. Then, lines of magnetic force decrease in the shift control layers 36A and 36B and outside the yoke 40.

The decrease in the lines of magnetic force reduces, in the MTJ elements 30 which have the respective antiparallel magnetization directions and which are adjacent to each other, the adverse effects, on the characteristics of the storage layer 32, the reference layer 34, and the like, of stray fields generated by the shift control layers 36A, 36B. As a result, as is the case with the first to fourth embodiments, the MRAM 1 according to the fifth embodiment enables changes in the characteristics of the MTJ elements 30 to be suppressed, allowing stabilization of memory operations such as the write, read, and data retention characteristics to be enhanced.

Even when the MTJ elements 30 have the same magnetization direction as depicted in FIG. 16, lines of magnetic force from the yoke 40 enter the MTJ elements 30 or lines of magnetic force from the MTJ elements 30 enter the yoke, resulting in a reduction in lines of magnetic force outside the yoke 40. In other words, the configuration in the present embodiment is effective for suppressing changes in the characteristics of the MTJ elements 30 without the need to alternate the magnetization directions of the MTJ elements 30.

Furthermore, in the fifth embodiment, the yoke 40 is provided all over the cell array 10. However, the present invention is not limited to this. For example, in a plan layout as depicted in FIG. 14, the yoke 40 may be omitted from any of the areas between the MTJ elements 30 which are obliquely adjacent to each other with respect to the X direction and the Y direction. The yoke 40 may be provided at least between the MTJ elements 30 which are adjacent to each other in the X direction and the Y direction.

[6] Sixth Embodiment

Now, an MRAM according to a sixth embodiment will be described. The present embodiment is the above-described fourth embodiment in which a conductive material is used as a material for the yoke. A configuration of the MRAM according to the sixth embodiment will be described below only in terms of differences from the first to fifth embodiments.

[6-1] Configuration and Layout of the Cell Array 10

Figure 17:
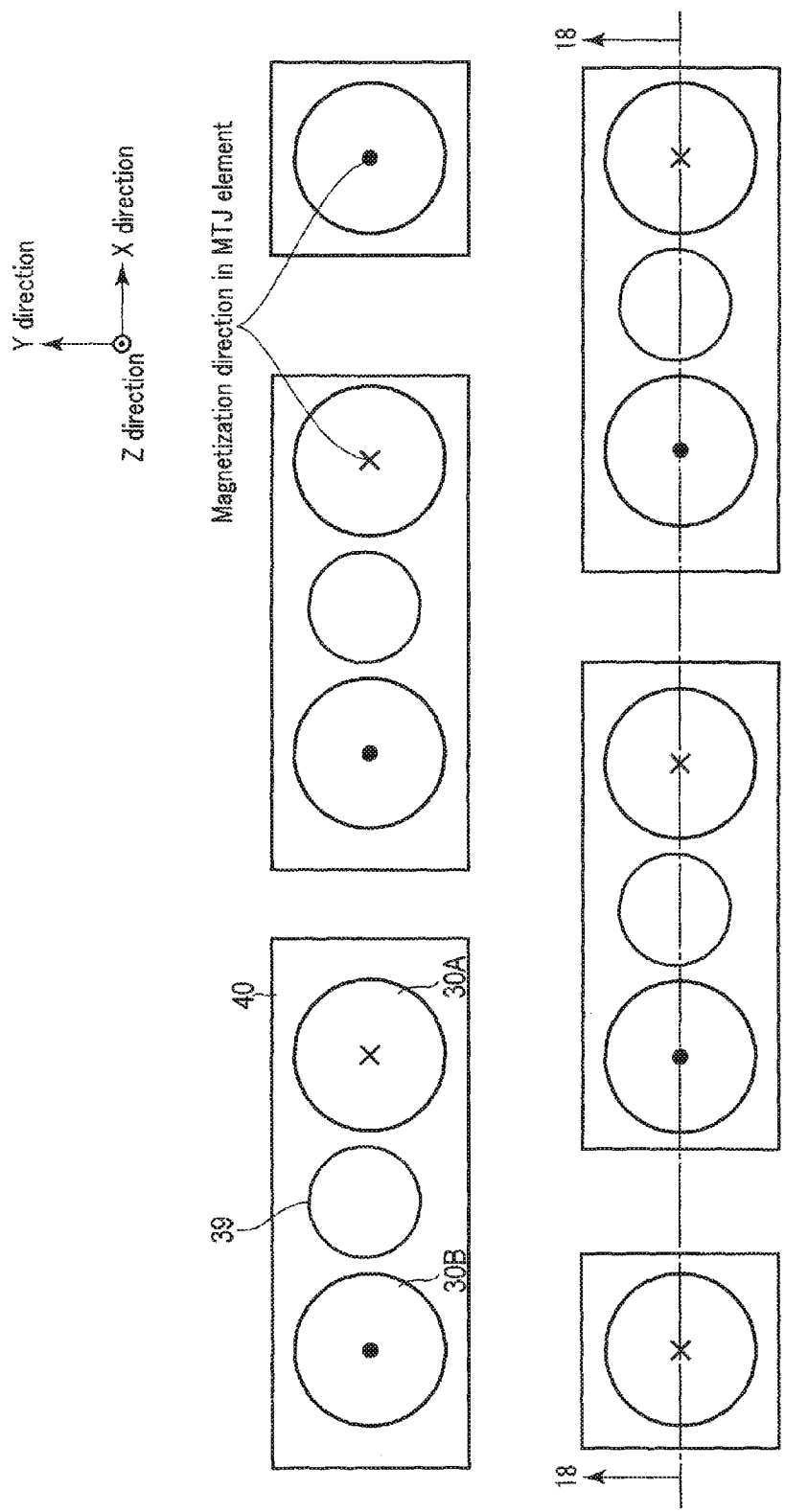
FIG. 17 is a plan layout diagram of MTJ elements in a cell array according to a sixth embodiment.
Figure 18:
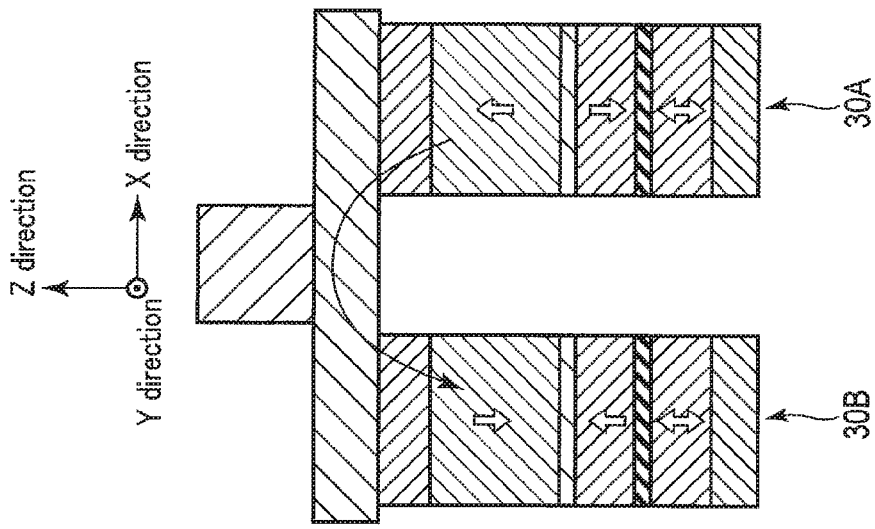
FIG. 18 is a sectional view taken along line 18-18 in FIG. 17.
Figure 18:
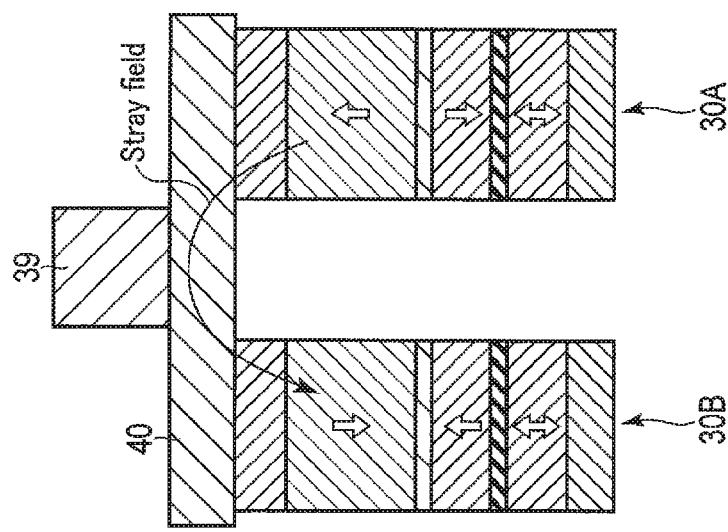
Figure 18:
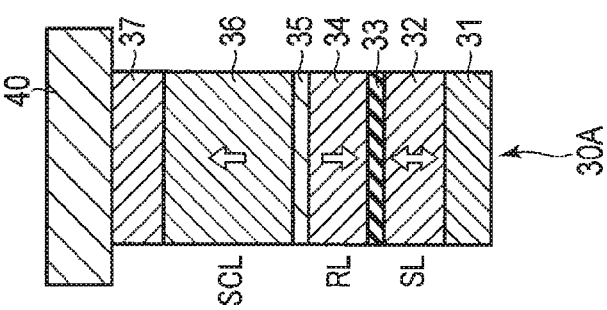

The configuration and layout of the cell array 10 will be described using FIG. 17 and FIG. 18. FIG. 17 is a plan layout of MTJ elements in the cell array 10. FIG. 18 is a sectional view taken along line 18-18 in FIG. 17 and depicts a part of stray fields generated in the shift control layers 36.

As depicted in FIG. 17, in the cell array 10, the MTJ elements 30A and 30B arranged in the X direction are included in the MTJ pair. In each MTJ pair, the conductive yoke 40 is provided so as to bridge the top portions of the MTJ elements 30A and 30B. The contact plug 39 is provided on the yoke 40, and the MTJ elements 30 in the MTJ pair share the bit line BL.

As depicted in FIG. 18, the yoke 40 is provided on the upper electrodes 37A, 37B in the MTJ elements 30 included in the MTJ pair. In other words, yoke 40 is in contact with the MTJ element 30A and the MTJ element 30B in MTJ pair. Furthermore, yoke 40 may be in contact with conductive layers on the MTJ elements 30A and 30B in MTJ pair. Moreover, the shift control layers 36 in the MTJ elements 30A and 30B are provided between the storage layers 32 and the yoke 40.

Consequently, as depicted in FIG. 18, a line of magnetic force traveling from the shift control layer 36A in the MTJ element 30A toward the upper electrode 37A side enters, through the upper electrode 37B side of the MTJ element 30B forming the pair via the yoke 40, the shift control layer 36B in the MTJ element 30B. Thus, a stray field as illustrated is formed. The contact plug 39 is provided on each yoke 40. The remaining parts of the configuration are similar to the corresponding parts in the first to fifth embodiments.

The MTJ elements included in the MTJ pairs in FIG. 17 are staggered. However, the present invention is not limited to this, and the MTJ elements need not be staggered. In addition, in FIG. 17, the two adjacent MTJ elements 30 in the X direction form the MTJ pair. However, the present invention is not limited to this, and the adjacent MTJ elements 30 in the Y direction may be included in the MTJ pair.

[6-2] Effects of the Sixth Embodiment

In the MRAM 1 according to the sixth embodiment, the MTJ pairs are each formed of the MTJ elements which have the respective antiparallel magnetization directions and which are adjacent to each other. The conductive yokes 40 are provided each of which bridges corresponding ends of the MTJ elements 30 in the MTJ pair. As depicted in FIG. 17, a line of magnetic force of a magnetic field generated in the shift control layer 36A in the MTJ element 30A is attracted to the yoke 40 and enters the shift control layer 36B in the MTJ element 30B forming the pair via the yoke 40. Then, lines of magnetic force decrease in the shift control layers 36A and 36B and outside the yoke 40.

This reduces the adverse effects, on the characteristics of the storage layer 32, the reference layer 34, and the like, of stray fields generated by the shift control layers 36A, 36B in the MTJ pair. As a result, as is the case with the first to fifth embodiments, the MRAM 1 according to the sixth embodiment enables changes in the characteristics of the MTJ elements 30 to be suppressed, allowing stabilization of memory operations such as the write, read, and data retention characteristics to be enhanced.

[7] Seventh Embodiment

Now, an MRAM according to a seventh embodiment will be described. The present embodiment relates to a more specific example of the cell array to which the configuration described in the above-described sixth embodiment is applied. The present embodiment will be described below only in terms of differences from the sixth embodiment.

[7-1] Configuration Example 1

Figure 19:
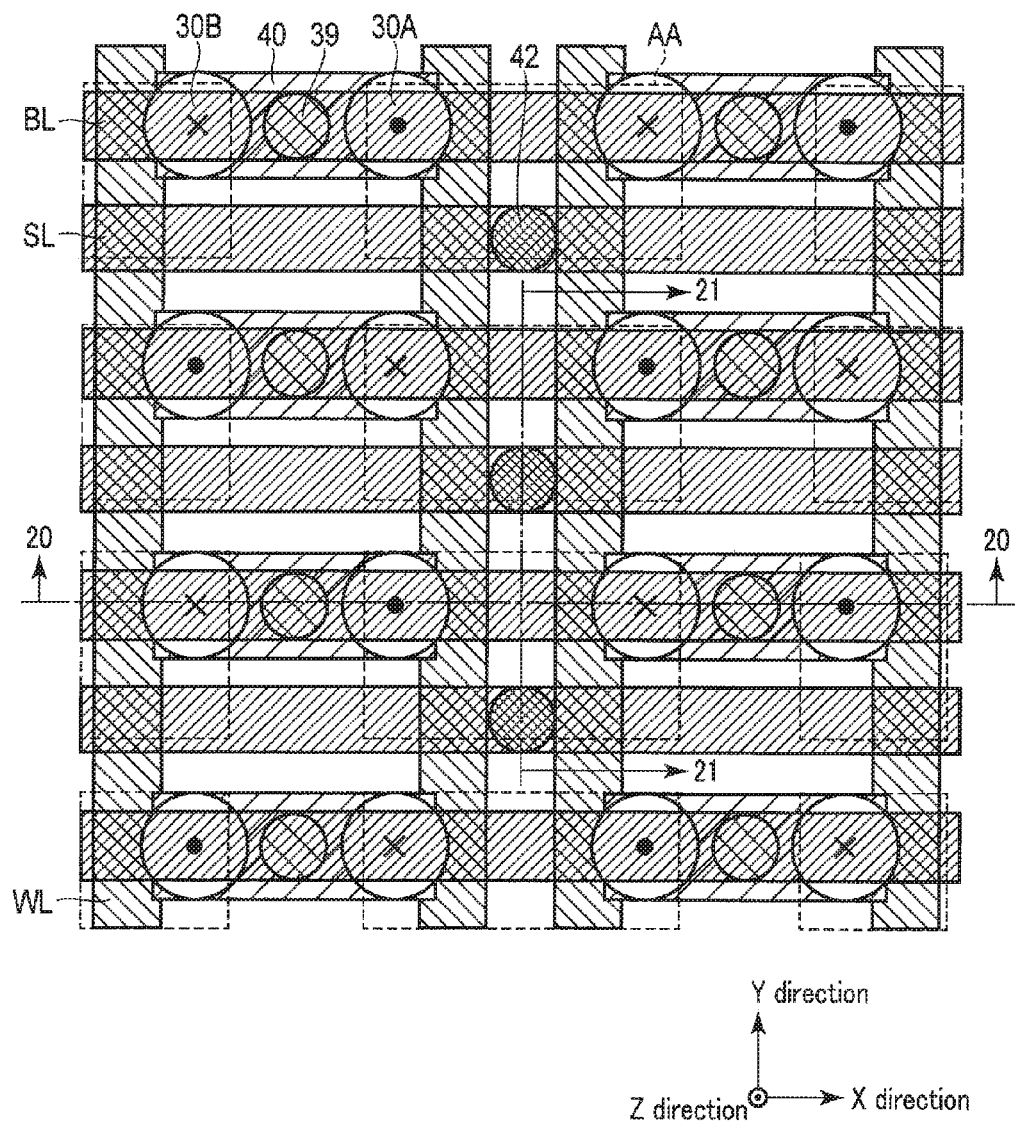
FIG. 19 is a plan layout diagram of a cell array according to Configuration Example 1 of the sixth embodiment.

First, the MRAM 1 according to Configuration Example 1 will be described using FIGS. 19 to 21. FIG. 19 is a plan layout of the cell array 10, FIG. 20 is a sectional view taken along line 20-20 in FIG. 19, and FIG. 21 is a sectional view taken along line 21-21 in FIG. 19.

First, a planar configuration in Configuration Example 1 will be described using FIG. 19. As depicted in FIG. 19, in the cell array 10, the MTJ elements 30A, 30B included in the MTJ pairs are arranged in a matrix. Furthermore, a plurality of the word lines WL along the Y direction are arranged along the X direction. More specifically, the plurality of word lines WL are provided such that two word lines WL pass under respective ends, along the X direction, of each of the MTJ pairs in the same column.

Furthermore, the rows of bit lines BL and source lines SL striped along the X direction are alternately arranged along the Y direction. Each of the bit lines BL is provided so as to pass over the MTJ pairs in the same row. On the other hand, each of the source lines SL is provided so as to pass over the areas between the MTJ pairs which are adjacent to each other in the Y direction.

Moreover, active areas AA are each provided under the two adjacent MTJ pairs in the X direction. The active area AA is an area where the cell transistor TR is formed. One end of the active area AA along the X direction overlaps the MTJ element 30A in one of the two corresponding MTJ pairs. The other end of the active area AA along the X direction overlaps the MTJ element 30B in the two corresponding MTJ pairs.

The active area AA is associated with a set of any bit line BL and the corresponding source line SL and further associated with a set of any two adjacent word lines WL. More specifically, over the active area AA, the two corresponding word lines WL extend longitudinally along the Y direction, and the bit line BL and source line SL corresponding to each other traverse along the X direction.

Moreover, contact plugs 42 are each provided in a part of the corresponding active area AA which is sandwiched between the two corresponding word lines WL.

As described above, in the configuration in FIG. 19, the word lines WL, the bit lines BL, and the source lines SL are laid out such that the word lines WL cross the bit lines BL and the source lines SL.

Now, a sectional configuration of Configuration Example 1 will be described using FIG. 20. As depicted in FIG. 20, active areas AA are formed in a semiconductor substrate (P-type well area) 50. Each of the active areas AA is an area where a semiconductor element is formed. Around each of the active areas AA, an isolation area not depicted in the drawings is provided to electrically separate the active areas AA from one another.

Cell transistors TR1, TR2 are formed on the active area AA. That is, in a front surface of the semiconductor substrate 50, two N+ type drain areas (impurity diffusion layer) 54b, and an N+ source area (impurity diffusion layer) 54a sandwiched between the drain areas 54b are provided. A gate electrode 52 (for example, a polycrystalline silicon layer) functioning as the word line WL is buried in an area between one of the drain areas 54b and the source area 54a and in an area between the other drain area 54b and the source area 54a. Moreover, an insulating film 53 is provided on the gate electrode 52. A gate insulating film 51 is provided around the gate electrode to electrically separate the gate electrode 52 from the areas 54a and 54b and the p-type well area. In this manner, the gate electrode 52, the drain area 54b, and the source area 54a form the transistor TR1 and the transistor TR2.

The MTJ elements 30A and 30B are formed on the semiconductor substrate 50. That is, on the drain area 54b, the lower electrode 31, the storage layer 32 (SL), the intermediate layer 33, the reference layer 34 (RL), the coupling layer 35, the shift control layer 36 (SCL), and the upper electrode 37 are stacked in this order from bottom to top. These layers form the MTJ elements 30A and 30B.

The MTJ element 30A is formed on the drain area 54b in the transistor TR1 in a certain active area AA. On the other hand, the MTJ element 30B is formed on the drain area 54b in the other transistor TR2 in the certain active area AA.

An interlayer insulating film not depicted in the drawings is formed on the semiconductor substrate 50 so as to coat the above-described MTJ elements. A magnetic layer 40 functioning as a yoke is provided on the interlayer insulating film so as to connect the MTJ elements 30A and 30B which are adjacent to each other in the X direction. Moreover, the contact plug 39 is formed on the magnetic layer 40, and a metal wiring layer 41 functioning as the bit line BL is formed on the contact plug 39.

Furthermore, as depicted in FIG. 21, the contact plug 42 is formed on the area 54a, which serves as a common source for the transistors TR1 and TR2. A metal wiring layer 43 functioning as the source line SL is formed on the contact plug 42.

Furthermore, Configuration Example 1 in the above description, MTJ elements 30 in MTJ pairs which are adjacent to each other may share the bit line BL and source line SL. In other words, in MTJ pairs which are adjacent to each other, the yoke 40 in one side MTJ pair is electrically connected to the yoke 40 in other side MTJ pair. In addition to one end of the transistor TR1 of the MTJ element 30A in one side MTJ pair is electrically connected to one end of the transistor TR2 of the MTJ element 30B in other side MTJ pair.

[7-2] Configuration Example 2

Figure 22:
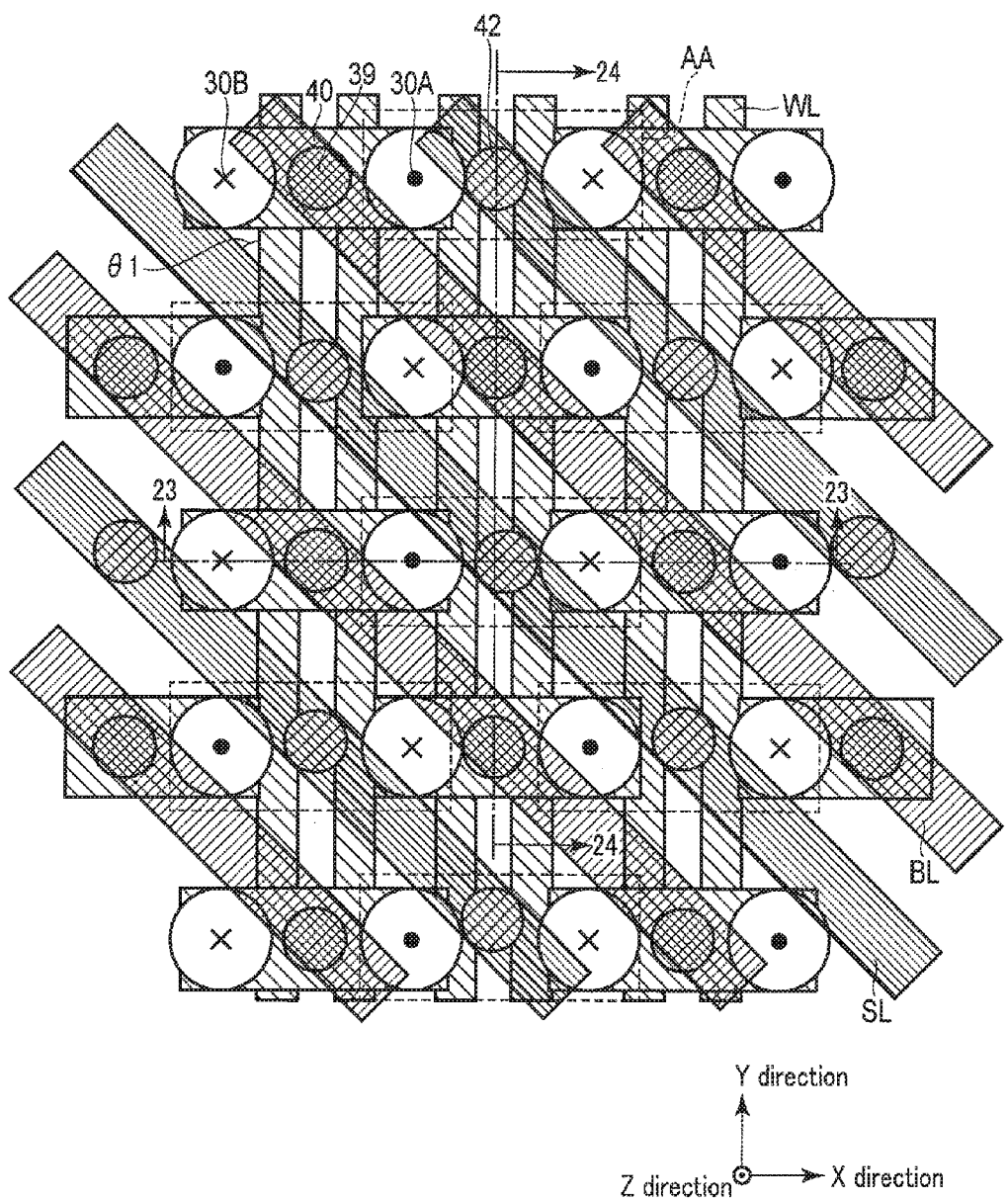
FIG. 22 is a plan layout diagram of a cell array according to Configuration Example 2 of the sixth embodiment.

Now, using FIGS. 22 to 24, the MRAM 1 according to Configuration Example 2 will be described in terms of differences from Configuration Example 1. FIG. 22 is a plan layout of the cell array 10, FIG. 23 is a sectional view taken along line 23-23 in FIG. 22, and FIG. 24 is a sectional view taken along line 24-24 in FIG. 22.

First, a planar configuration in Configuration Example 2 will be described using FIG. 22. As depicted in FIG. 22, in the cell array 10, the MTJ elements 30A, 30B forming the MTJ pairs in the X direction are staggered in the Y direction. Furthermore, in Configuration Example 2, the plurality of word lines WL are provided such that two word lines WL pass under respective ends, along the X direction, of the MTJ elements 30 in the same column.

Furthermore, in Configuration Example 2, the bit lines BL and the source lines SL cross the word lines WL in an XY plane. Specifically, an angle at which the bit lines BL and the source lines SL cross the word lines WL is approximately 45° ($\theta 1=45°$). Each of the bit lines BL is provided so as to pass over the MTJ pairs arranged in an extending direction of the bit lines BL and the source lines SL. On the other hand, each of the source lines SL is provided so as to pass over the areas between the adjacent MTJ pairs in the X direction. That is, the bit lines BL and the source lines SL cross a longitudinal direction of the yoke 40 included in the MTJ pairs.

Moreover, the active areas AA are each provided under the two adjacent MTJ pairs in the X direction. That is, in Configuration Example 2, the active areas AA are staggered in the Y direction. Furthermore, the contact plugs 42 each formed on the active area AA are provided in the area between the adjacent MTJ pairs in the X direction.

Now, a sectional configuration of Configuration Example 2 will be described using FIG. 23. As depicted in FIG. 23, in a front surface of the semiconductor substrate 50, the insulating films 51, 53 and the gate electrodes 52 are provided so as to sandwich the N+ drain area 54b between sets of the insulating films 51, 53 and the gate electrode 52. Furthermore, the contact plug 42 is provided between the adjacent contact plugs 39. The different metal wiring layers 41, 43 are formed on the respective contact plugs 39, 42 alternated in the X direction.

Moreover, as depicted in FIG. 24, each of the active areas AA formed in the cell array 10 is smaller than the active area AA in Configuration Example 1.

As described above, in Configuration Example 2 of the MRAM 1 according to the sixth embodiment, the word lines WL, the bit lines BL, and the source lines SL are arranged. Configuration Example 1 has higher wire integration than Configuration Example 2 and thus enables a reduction in circuit area or an increase in storage capacity compared to Configuration Example 1.

The arrangement of the bit lines BL, the source lines SL, and the word lines WL is not limited to the arrangement in FIG. 2. For example, in the MRAM 1 in Configuration Example 2, any arrangement is possible so long as the bit lines BL and the source lines SL cross the word lines WL. Furthermore, MRAM 1 in Configuration Example 2 is particularly effective for suppressing the area when the bit lines BL and the source lines SL cross the word lines WL at approximately 450°.

Furthermore, Configuration Example 2 in the above description, MTJ elements 30 in MTJ pairs which are adjacent to each other may share source line SL and not share the bit line BL. In other words, in MTJ pairs which are adjacent to each other, the bit line electrically connected to one side MTJ pair is different from the bit line electrically connected to other side MTJ pair. In addition to one end of the transistor TR1 of the MTJ element 30A in one side MTJ pair is electrically connected to one end of the transistor TR2 of the MTJ element 30B in other side MTJ pair.

[8] Modifications and the Like

A magnetic memory device according to the above-described embodiments includes a first magnetoresistive element and a second magnetoresistive element (30A and 30B in FIG. 18) which are adjacent to each other. Each of the first and second magnetoresistive elements includes a first magnetic layer (32 in FIG. 2), a first non-magnetic later (33 in FIG. 2) on the first magnetic layer, a second magnetic layer (34 in FIG. 2) on the first non-magnetic layer, a second non-magnetic layer (35 in FIG. 2) on the second magnetic layer, and a third magnetic layer (36 in FIG. 2) on the second non-magnetic layer. Furthermore, the magnetic memory device further includes a fourth magnetic layer (40 in FIG. 18) being in contact with the first and second magnetoresistive elements or in contact with conductive layers on the first and second magnetoresistive elements. The third magnetic layer in the first and second magnetoresistive elements are provided between the first magnetic layer and the fourth magnetic layer. A thickness of the third magnetic layer is thicker than a thickness of the first magnetic layer.

Moreover, the first to third magnetic layers have a magnetization parallel to a stacking direction of the first and second magnetoresistive elements. The second magnetic layer and the third magnetic layer have respective antiparallel magnetization directions. A magnetization direction in the third magnetic layer in the first magnetoresistive element is antiparallel to a magnetization direction in the third magnetic layer in the second magnetoresistive element.

This enables data in the MRAM 1 to be made more reliable.

The embodiments are not limited to the above-described first to sixth embodiments, to which various modifications may be made. For example, the cell array 10 may have another configuration. The configuration of the cell array 10 is described in, for example, U.S. patent application Ser. No. 13/970,421 titled "Semiconductor storage device" and filed on Aug. 19, 2013. The configuration of the cell array 10 is also described in U.S. patent application Ser. No. 14/018,337 titled "Magnetic memory and manufacturing method there of" and filed on Sep. 4, 2013. These patent applications are incorporated herein by reference in their entirety.

Furthermore, in each of the embodiments, the magnetization directions in the MTJ elements 30 arranged in a matrix are alternated in the X direction and in the Y direction. However, the present invention is not limited to this. For example, the magnetization directions in the MTJ elements 30 may be alternated exclusively in the X direction or in the Y direction. In addition, the MRAM 1 may include portions in which the magnetization directions in the MTJ elements 30 are not alternated.

Furthermore, in Configuration Example 2 in the seventh embodiment, the area suppression effect is particularly effective when the bit lines BL and the source lines SL cross the word lines WL at approximately 45°. However, the present invention is not limited to this. The optimum angle at which the bit lines BL and the source lines SL cross the word lines WL may vary, for example, based on the arrangement of the active areas AA, the direction of the word lines WL, the intervals at which the bit lines BL are arranged, and the like. For example, in the configuration of the cell array described in U.S. patent application Ser. No. 13/970,421 titled "Semiconductor storage device" and filed on Aug. 19, 2013, the optimum angle at which the bit lines and the source lines cross the word lines is approximately 63°.

Furthermore, in the second and third embodiments, the yoke 40 is electrically conductive. However, the present invention is not limited to this. For example, a non-conductive yoke 40 may be used instead of the conductive yoke 40.

Furthermore, in the above description, the electric connection includes a case where another element is connected between connected elements.

Additionally, in the above description, the "stacking direction" refers to the direction in which the layers such as the storage layer 32, the intermediate layer 33, and the reference layer 34 which are included in the MTJ element are stacked. In addition, the "stacking direction" is interchangeable with a direction perpendicular to the semiconductor substrate.

Furthermore, in the above description, the bit lines BL and source lines SL are provided same layer. However, the present invention is not limited to this. For example, a layer which is provided the bit lines BL may be arranged above a layer which is provided the source lines SL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a first magnetoresistive element and a second magnetoresistive element each including a first magnetic layer, a first non-magnetic layer on the first magnetic layer, a second magnetic layer on the first non-magnetic layer, a second non-magnetic layer on the second magnetic layer, and a third magnetic layer on the second non-magnetic layer, the first and second magnetoresistive elements being adjacent to each other; and
    a fourth magnetic layer being in contact with the first and second magnetoresistive elements or in contact with conductive layers on the first and second magnetoresistive elements, wherein
    the third magnetic layers in the first and second magnetoresistive elements are provided between the first magnetic layers and the fourth magnetic layer, and
    a thickness of the third magnetic layer is thicker than a thickness of the first magnetic layer.

2. The device of claim 1, wherein
the first magnetic layer having a lower coersive force than the second magnetic layer,
the third magnetic layer having a higher coersive force than the second magnetic layer.

3. The device of claim 1, wherein
the first to third magnetic layers have a magnetization direction parallel to a stacking direction of the first to third magnetic layers,
the second magnetic layer and the third magnetic layer have respective antiparallel magnetization directions, and
a magnetization direction in the third magnetic layer in the first magnetoresistive element is antiparallel to a magnetization direction in the third magnetic layer in the second magnetoresistive element.

4. The device of claim 3, further comprising:
a first wire electrically connected to the fourth magnetic layer;
a first transistor, one end of the first transistor electrically connected to the first magnetic layer in the first magnetoresistive element; and
a second wire electrically connected to a gate of the first transistor, wherein
the second wire crosses the first wire.

5. The device of claim 4, further comprising:
the first magnetoresistive element and the second magnetoresistive element each including the first magnetic layer, the first non-magnetic layer on the first magnetic layer, the second magnetic layer on the first non-magnetic layer, the second non-magnetic layer on the second magnetic layer, and the third magnetic layer on the second non-magnetic layer, the third and fourth magnetoresistive elements being adjacent to each other; and
a fifth magnetic layer being in contact with the third and fourth magnetoresistive elements, or in contact with conductive layers on the third and fourth magnetoresistive elements, wherein
the first and third magnetoresistive elements are adjacent to each other,
the third magnetic layers in the third and fourth magnetoresistive elements are provided between the first magnetic layers and the fourth magnetic layer, and
a longitudinal direction of the fourth magnetic layer is substantially parallel to a longitudinal direction of the fifth magnetic layer, and crosses the second wire.

6. The device of claim 5, further comprising
a second transistor, one end of the second transistor electrically connected to the first magnetic layer in the third magnetoresistive element, other end of the second transistor electrically connected to other end of the first transistor, wherein
the fifth magnetic layer is electrically connected to the first wire.

7. The device of claim 6, wherein the second wire is orthogonal to the first wire.

8. The device of claim 5, further comprising:
a second transistor, one end of the second transistor electrically connected to the first magnetic layer in the third magnetoresistive element, a gate of the second transistor electrically connected to the second wire; and
a third wire electrically connected to the fifth magnetic layer, the third wire being different from the first wire.

9. The device of claim 4, further comprising
a third wire electrically connected to other end of the first transistor, wherein
the third wire is substantially parallel to the first wire.

10. A magnetic memory device comprising:
a first magnetoresistive element, a second magnetoresistive element, and a third magnetoresistive element each including a first magnetic layer, a first non-magnetic layer on the first magnetic layer, a second magnetic layer on the first non-magnetic layer, a second non-magnetic layer on the second magnetic layer, and a third magnetic layer on the second non-magnetic layer; and
a fourth magnetic layer between the first magnetoresistive element and the second magnetoresistive element, wherein
a thickness of the third magnetic layer is thicker than a thickness of the first magnetic layer,
the first magnetoresistive element and the second magnetoresistive element are adjacent to each other with the fourth magnetic layer interposed between the first and second magnetoresistive elements, and
the first magnetoresistive element and the third magnetoresistive element are adjacent to each other with no magnetic layer interposed between the first and third magnetoresistive element.

11. The device of claim 10, wherein
the first to third magnetic layers have a magnetization parallel to a stacking direction of the first to third magnetic layers,
the second magnetic layer and the third magnetic layer have respective antiparallel magnetization directions, and
a magnetization direction in the third magnetic layer in the first magnetoresistive element is antiparallel to a magnetization direction in the third magnetic layers in the second and third magnetoresistive elements.

12. The device of claim 10, wherein
the fourth magnetic layer is arranged between an upper portion of the first magnetoresistive element and an upper portion of the second magnetoresistive element.

13. The device of claim 10, wherein
the second magnetic layer has a higher coersive force than the first magnetic layer, and the third magnetic layer has a higher coersive force than the second magnetic layer, and
the fourth magnetic layer is provided between the third magnetic layer in the first magnetoresistive element and the third magnetic layer in the second magnetoresistive element.

14. The device of claim 10, wherein
the fourth magnetic layer is electrically conductive and is insulated from the first and second magnetoresistive elements.

15. The device of claim 10, wherein the fourth magnetic layer is electrically non-conductive.

16. A magnetic memory device comprising
a first magnetoresistive element and a second magnetoresistive element each including a first magnetic layer, a first non-magnetic layer on the first magnetic layer, a second magnetic layer on the first non-magnetic layer, a second non-magnetic layer on the second magnetic layer, and a third magnetic layer on the second non-magnetic layer, the first and second magnetoresistive elements being adjacent to each other, wherein the first to third magnetic layers have a magnetization direction parallel to a stacking direction of the first to third magnetic layers, the second magnetic layer and the third magnetic layer have respective antiparallel magnetization directions, and a magnetization direction in the third magnetic layer in the first magnetoresistive element is antiparallel to a magnetization direction in the third magnetic layer in the second magnetoresistive element.

17. The device of claim 16, further comprising a non-conductive fourth magnetic layer being in contact with the first and second magnetoresistive elements, or in contact with conductive layers on the first and second magnetoresistive elements, wherein the third magnetic layers in the first and second magnetoresistive elements are provided between the first magnetic layers and the fourth magnetic layer.

18. The device of claim 17, further comprising:

a third magnetoresistive element which is adjacent to the first magnetoresistive element;

a fourth magnetoresistive element which is adjacent to the third magnetoresistive element; and a non-conductive fifth magnetic layer being in contact with the third and fourth magnetoresistive elements, or in contact with conductive layers on the third and fourth magnetoresistive elements, wherein longitudinal directions in the fourth and fifth magnetic layers are substantially parallel to each other.

19. The device of claim 17, further comprising:

a third magnetoresistive element which is adjacent to the first magnetoresistive element;

a fourth magnetoresistive element which is adjacent to the third magnetoresistive element; and a non-conductive fifth magnetic layer being in contact with the third and fourth magnetoresistive elements, or in contact with conductive layers on the third and fourth magnetoresistive elements, wherein longitudinal directions in the fourth and fifth magnetic layers cross each other.

20. The device of claim 17, further comprising a third magnetoresistive element which is adjacent to the first magnetoresistive element, wherein the fourth magnetic layer is in contact with the third magnetoresistive element, or a conductive layer on the third magnetoresistive element.

\* \* \* \* \*